(12) United States Patent
Wuu et al.

(10) Patent No.: US 11,177,245 B2
(45) Date of Patent: Nov. 16, 2021

(54) LARGE AREA PASSIVE MICRO LIGHT-EMITTING DIODE MATRIX DISPLAY

(71) Applicant: NATIONAL CHUNG-HSING UNIVERSITY, Taichung (TW)

(72) Inventors: Dong-Sing Wuu, Taichung (TW); Shuo-Huang Yuan, Taichung (TW); Po-Wei Chen, Taichung (TW); Ray-Hua Horng, Taichung (TW)

(73) Assignee: NATIONAL CHUNG-HSING UNIVERSITY, Taichung (TW)

( * ) Notice: Subject to any disclaimer, the term of this patent is extended or adjusted under 35 U.S.C. 154(b) by 95 days.

(21) Appl. No.: 16/854,531

(22) Filed: Apr. 21, 2020

(65) Prior Publication Data

US 2021/0183825 A1 Jun. 17, 2021

(30) Foreign Application Priority Data

Dec. 13, 2019 (TW) ................................ 108145828

(51) Int. Cl.
| | |
|---|---|
| *H01L 25/075* | (2006.01) |
| *H01L 33/38* | (2010.01) |
| *H01L 33/62* | (2010.01) |
| *H01L 25/16* | (2006.01) |
| *H01L 33/44* | (2010.01) |

(52) U.S. Cl.
CPC ........ *H01L 25/0753* (2013.01); *H01L 25/167* (2013.01); *H01L 33/38* (2013.01); *H01L 33/44* (2013.01); *H01L 33/62* (2013.01)

(58) Field of Classification Search
CPC ..... H01L 25/0753; H01L 33/38; H01L 33/62; H01L 25/167; H01L 33/44; H01L 27/156
See application file for complete search history.

(56) References Cited

U.S. PATENT DOCUMENTS

| | | | |
|---|---|---|---|
| 10,255,834 B2 * | 4/2019 | Cok .................... G09G 3/2003 |
| 10,380,930 B2 * | 8/2019 | Cok .................... G09G 3/3208 |
| 2015/0371585 A1 * | 12/2015 | Bower ................... H01L 33/50 |
| | | | 345/1.1 |
| 2017/0103926 A1 * | 4/2017 | Aoyagi .................. H01L 33/58 |
| 2017/0294479 A1 * | 10/2017 | Cha ....................... H01L 33/507 |
| 2018/0190615 A1 * | 7/2018 | Pan ........................ G06F 3/044 |
| 2018/0197471 A1 * | 7/2018 | Rotzoll ................ H01L 25/167 |
| 2018/0269191 A1 * | 9/2018 | England ............... H01L 27/156 |
| 2019/0191574 A1 * | 6/2019 | Kim ...................... G09F 9/3026 |
| 2020/0194407 A1 * | 6/2020 | Choi ................... H01L 27/1214 |
| 2021/0028333 A1 * | 1/2021 | Wuu ...................... H01L 24/13 |
| 2021/0167047 A1 * | 6/2021 | Lee ..................... H01L 25/0753 |
| 2021/0241684 A1 * | 8/2021 | Ogawa ..................... G09F 9/33 |

\* cited by examiner

*Primary Examiner* — Victor A Mandala
(74) *Attorney, Agent, or Firm* — MLO, a professional corp.

(57) ABSTRACT

A large area passive micro light-emitting diode matrix display includes a plurality of micro light-emitting diode matrices and an external circuit component. Each of the micro light-emitting diode matrices includes a first layer, a plurality of light-emitting layers disposed on the first layer, a plurality of second layers disposed on the light-emitting layers, respectively, a plurality of first inner electrode layers disposed on the second layers, respectively, and a second inner electrode layer which is disposed on the first layer, and which includes a first portion and a second portion having a plurality of through holes to accommodate said light-emitting layers, respectively.

9 Claims, 21 Drawing Sheets

LARGE AREA PASSIVE MICRO LIGHT-EMITTING DIODE MATRIX DISPLAY

CROSS-REFERENCE TO RELATED APPLICATION

This application claims priority of Taiwanese Invention Patent Application No. 108145828, filed on Dec. 13, 2019.

FIELD

The disclosure relates to a passive micro light-emitting diode matrix display, and more particularly to a large area passive micro light-emitting diode matrix display.

BACKGROUND

Conventional light-emitting diode (LED) displays can be classified into active LED displays and passive LED displays in terms of the driving method thereof, or into large area LED displays and small area LED displays in terms of the area thereof. The large area passive LED displays are usually used for outdoor LED billboards, and are made by assembling a plurality of single-packaged LED units to display images. However, the image resolution of the large area passive LED displays is unsatisfactory and should be improved. In addition, a seven-segment display is a form of a small area LED display that uses various combinations of eight LED segments for displaying decimal numbers and a decimal point.

Referring to FIGS. 1 and 2, a conventional common cathode seven-segment display 1 is primarily constituted by eight LED segments 11 and ten pins 12. Each of the LED segments 11 has an anode and a cathode, best shown in FIG. 2. All the cathodes of the LED segments 11 are grounded. The middle ones of pins 12 at two sides of the common cathode seven-segment display 1 are also grounded, and the remaining ones of pins 12 are electrically connected to the anodes of the LED segments 11, respectively. Although the common cathode seven-segment display 1 is suitably used for small area displays, it is only useful for displaying numbers and the flexibility of the image presented thereby is limited.

In addition, with the evolution of technology and growing market demand, relevant research on various miniaturized and lightweight electronic devices have become mainstream development of many electronic companies. The miniaturized and lightweight electronic devices are usually provided with a micro-LED display that is constituted by micro-LEDs.

An article entitled "Fabrication and Study on Red Light Micro-LED Displays" published in Journal of the Electron Devices Society, Volume 6, 2018, by the applicants discloses a passive micro-LED display, the structures and the fabrication method of which are described in details in the background section of the specification of Taiwanese Patent Application No. 108126000.

The passive micro-LED display disclosed in the article includes a pixel array of 64 columns and 32 rows so as to present images that are more flexible and variable. However, as described in the background section of the specification of Taiwanese Patent Application. No. 108126000, a double-sided polished sapphire substrate of the passive micro-LED display cannot be effectively used for forming LED chips thereon due to some area of the double-sided polished sapphire substrate being used for forming external circuits thereon for electrically connecting an external driver chip, thereby comprising the pixel number of the micro-LED display.

Furthermore, the size of the passive micro-LED display disclosed in the article is small (a diameter of only 2 inches). If a large area passive micro-LED display is fabricated using the method for fabricating the passive micro-LED display, a large area of GaAs substrate would be required for forming a light-emitting layer thereon via an epitaxial growth process. When some of the LED chips in the micro-LED matrix of the large area passive micro-LED display cannot be operated or emit light, the image quality and the image resolution of the large area passive micro-LED display will be adversely affected. Such large area passive micro-LED display may be eliminated by a manufacturer who requires high image quality and image resolution, causing undesirable increase in production cost.

SUMMARY

Therefore, an object of the disclosure is to provide a large area passive micro light-emitting diode matrix display to overcome the shortcomings described above by utilizing a substrate included therein relatively effectively and instantly determining whether the components included therein are operated normally.

According to the disclosure, there is provided a large area passive micro light-emitting diode matrix display, which includes a plurality of micro light-emitting diode matrices and an external circuit component.

Each of the micro light-emitting diode matrices includes a substrate, a plurality of micro light-emitting matrices, and a first insulation layer.

The substrate has a matrix-mounting surface, which has a first side edge extending in a first direction and a second side edge extending in a second direction transverse to the first direction.

The micro light-emitting matrices are mounted on the matrix-mounting surface and are spaced apart from each other in the second direction. Each of the micro light-emitting matrices includes a first layer, a plurality of light-emitting layers, a plurality of second layers, a plurality of first inner electrode layers, and a second inner electrode layer. The first layer is disposed on the matrix-mounting surface and extends in the first direction. The light-emitting layers are disposed on the first layer and are spaced apart from each other in the first direction. The second layers are disposed on the light-emitting layers, respectively. The first inner electrode layers are disposed on the second layers, respectively. The second inner electrode layer is disposed on the first layer, and includes a first portion which is proximate to the second side edge of the matrix-mounting surface and a second portion which extends from the first portion in the first direction and which has a plurality of through holes to accommodate the light-emitting layers, respectively.

The first insulation layer covers the matrix-mounting surface to permit the micro light-emitting matrices to be partially embedded in the first insulation layer and to permit the first portion of the second inner electrode layer and the first inner electrode layers of each of the micro light-emitting matrices to be exposed from the first insulation layer.

The external circuit component includes a carrier, a plurality of first external circuits, a plurality of second external circuits, a second insulation layer, and an electrical bonding unit.

The carrier includes a first surface and a second surface opposite to the first surface. The first surface has a first side edge extending in the first direction and a second side edge extending in the second direction, and includes a first circuit-mounting region and a second circuit-mounting region opposite to each other in the first direction.

The first external circuits are spaced apart from each other, and are divided into a first group of the first external circuits and a second group of the first external circuits mounted on the first circuit-mounting region and the second circuit-mounting region of the first surface of the carrier, respectively. Each of the first external circuits includes a first extending segment extending in the second direction. Each of the first group of the first external circuits exclusive of an innermost one of the first group of the first external circuits proximate to the second group of the first external circuits further includes a second extending segment extending in the first direction from an end portion of the first extending segment thereof distal from the first side edge of the first surface of the carrier. Each of the second group of the first external circuits exclusive of an innermost one of the second group of the first external circuits proximate to the first group of the first external circuits further includes a second extending segment extending in the first direction from an end portion of the first extending segment thereof distal from the first side edge of the first surface of the carrier.

The second external circuits are mounted above the first surface of the carrier, are spaced apart from each other in the first direction, extend in the second direction, and are disposed between the first extending segments of the first group of the first external circuits and the first extending segments of the second group of the first external circuits. Each of the second external circuits includes an extending segment extending in the second direction.

The second insulation layer covers the first surface of the carrier to permit the first and second external circuits to expose from the second insulation layer.

The electrical bonding unit is disposed on the first and second external circuits exposed from the second insulation layer.

The micro light-emitting diode matrices are disposed proximate to one another and spaced apart from one another on the external circuit component so as to permit the first portion of the second inner electrode layer and the first inner electrode layers of each of the micro light-emitting matrices of each of the micro light-emitting diode matrices to electrically bond the electrical bonding unit of the external circuit component.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
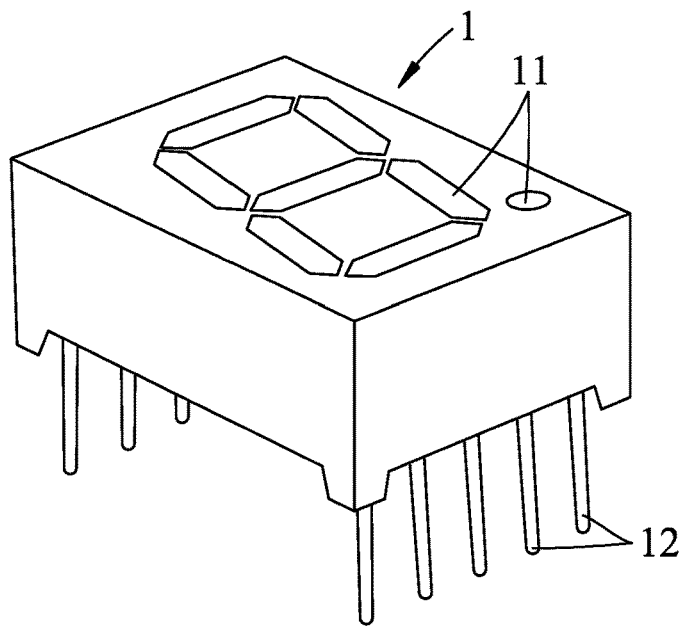
FIG. 1 is a perspective view of a conventional common cathode seven-segment display.
Figure 2:
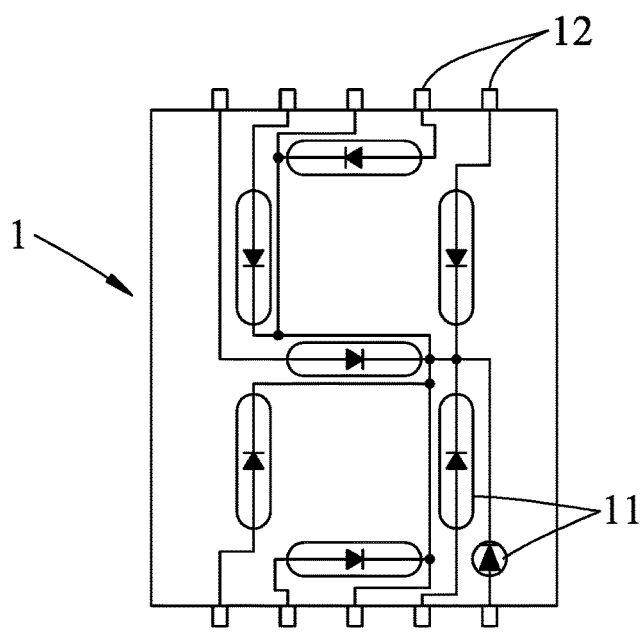
FIG. 2 is a schematic circuit diagram the conventional common cathode seven-segment display.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 3 to 8, a first embodiment of a large area passive micro light-emitting diode matrix device according to the disclosure is adapted to electrically bond a printed circuit board 9 (for example, a soft printed circuit board) of a driver chip (not shown), and includes a plurality of micro light-emitting diode matrices 2 and an external circuit component 3.

Each of the micro light-emitting diode matrices 2 includes a substrate 21, a plurality of micro light-emitting matrices 22, a first insulation layer 23.

The substrate 21 has a matrix-mounting surface 211, which has a first side edge 2111 extending in a first direction (X) and a second side edge 2112 extending in a second direction (Y) transverse to the first direction (X). The substrate 21 is a double-sided polished sapphire substrate.

The micro light-emitting matrices 22 are mounted on the matrix-mounting surface 211 and are spaced apart from each other in the second direction (Y). Each of the micro light-emitting matrices 22 includes a first layer 221, a plurality of light-emitting layers 222, a plurality of second layers 223, a plurality of first inner electrode layers 224, and a second inner electrode layer 225. The first layer 221 is disposed on the matrix-mounting surface 211 and extends in the first direction (X). The light-emitting layers 222 are disposed on the first layer 221 and are spaced apart from each other in the first direction (X). The second layers 223 are disposed on the light-emitting layers 222, respectively. The first inner electrode layers 224 are disposed on the second layers 223, respectively. The second inner electrode layer 225 is disposed on the first layer 221, and includes a first portion 2251 proximate to the second side edge 2112 of the matrix-mounting surface 211 and a second portion 2252 extending from the first portion 2251 in the first direction (X) and having a plurality of through holes 2253 to accommodate the light-emitting layers 222, respectively.

Figure 3:
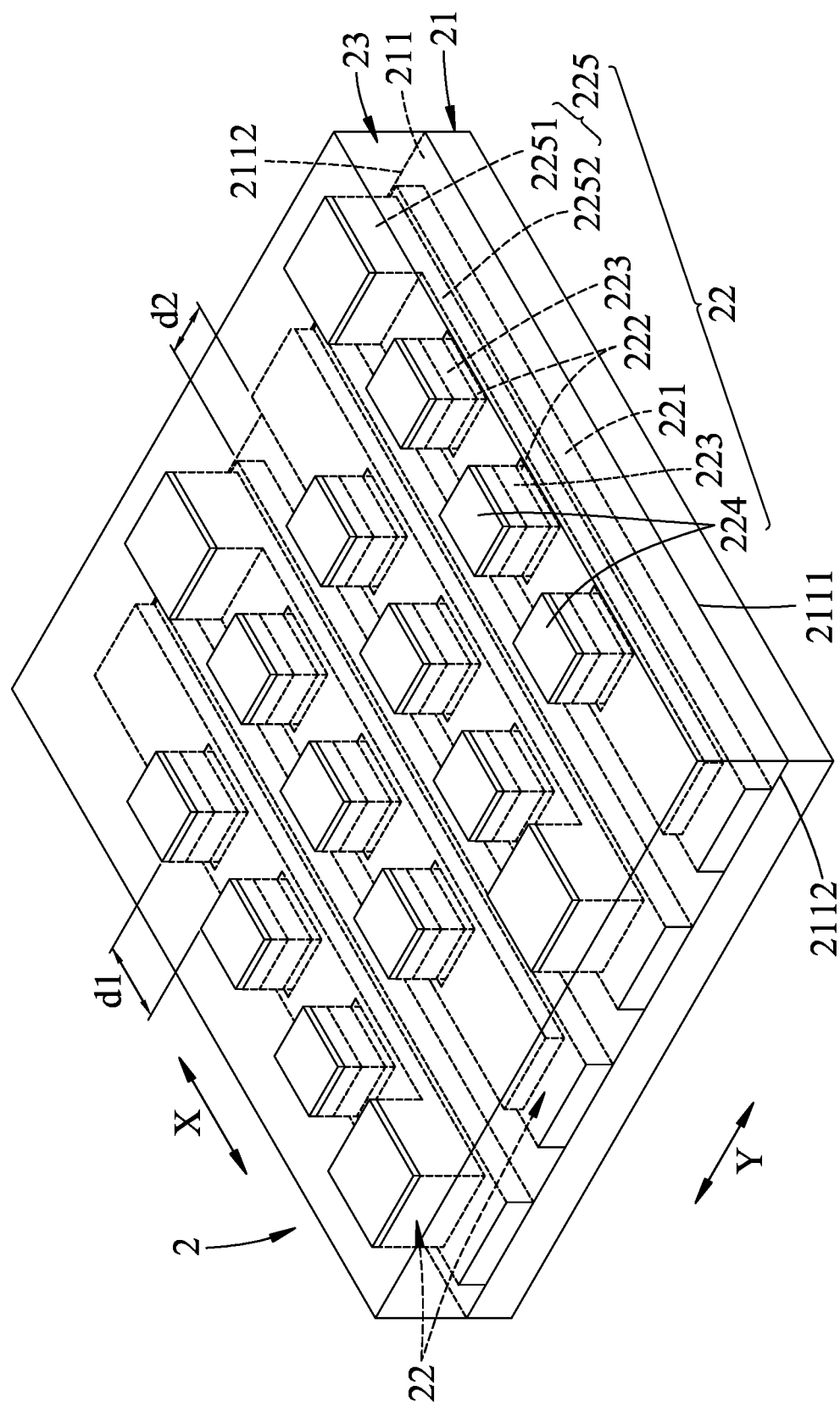
FIG. 3 is a perspective view of a micro light-emitting diode matrix included in a first embodiment of a large area passive micro light-emitting diode matrix device according to the disclosure.
Figure 4:
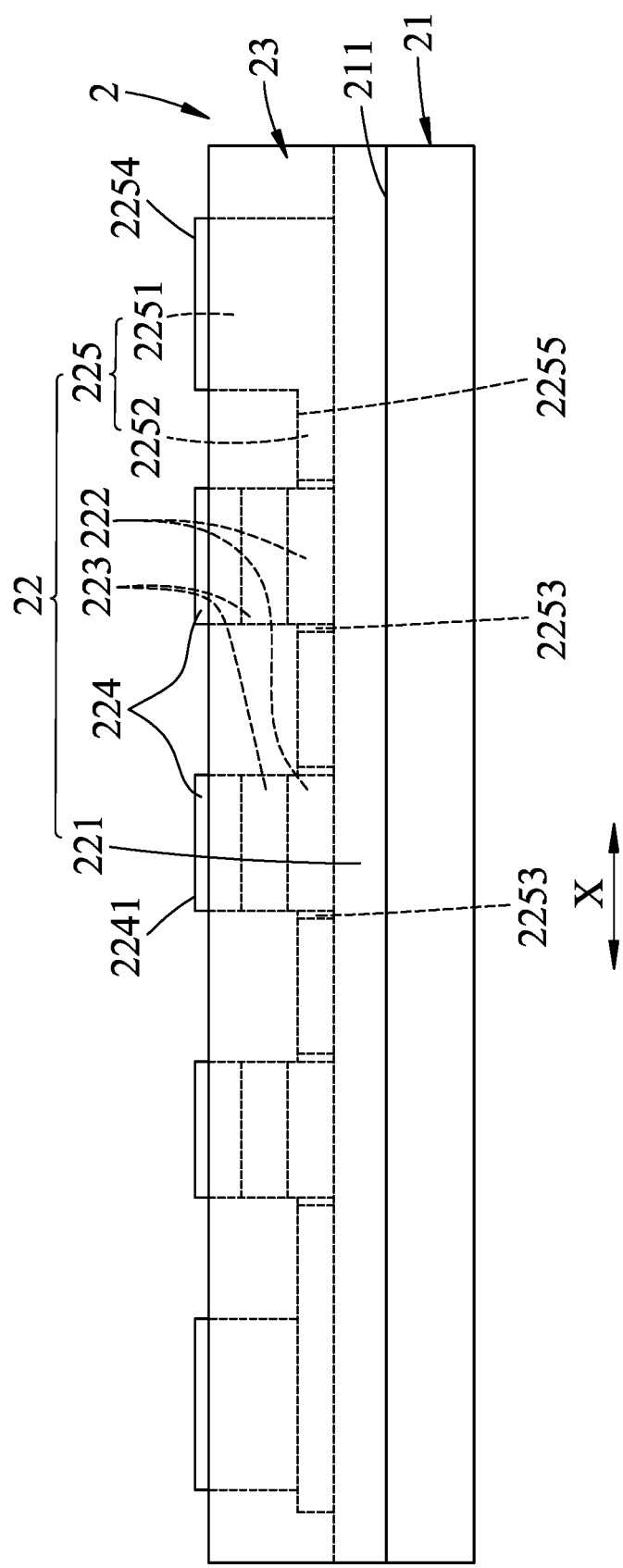
FIG. 4 is a schematic front view of the large area passive micro light-emitting diode matrix of FIG. 3.

Referring specifically to FIGS. 3 and 4, the first insulation layer 23 covers the matrix-mounting surface 211 to permit the micro light-emitting matrices 22 to be partially embedded in the first insulation layer 23 and to permit the first portion 2251 of the second inner electrode layer 225 and the first inner electrode layers 224 of each of the micro light-emitting matrices 22 to be exposed from the first insulation layer 23.

In the first embodiment, the first portion 2251 of the second inner electrode layer 225 has a top surface 2254, the second portion 2252 of the second inner electrode layer 225 has a top surface 2255 lower than the top surface 2254 of the first portion 2251 of the second inner electrode layer 225, and each of the first inner electrode layers 224 has a top surface 2241 flush with the top surface 2254 of the first portion 2251 of the second inner electrode layer 225.

The first layer 221 is an n-GaN layer. Each of the second layers 223 is a p-GaN layer. Each of the first inner electrode layers 224 is an ITO layer. The second inner electrode layer 225 is made of a metal, such as Au, Ag, Al, Ag, Cu, or Ti. The first insulation layer 23 is made of Su-8 photoresist, silica, or alumina.

In addition, the number of the micro light-emitting matrices 22 is 32. That is, the micro light-emitting diode matrix 2 includes 32 rows of the micro light-emitting matrices 22. The numbers of the light-emitting layers 222 and the second layers 223 on the first layer 221 of each of the micro light-emitting matrices 22 are 64. The first layer 221, the light-emitting layers 222, and the second layers 223 of each of the micro light-emitting matrices 22 are formed together into 64 micro-LED chips. In other words, the micro light-emitting diode matrix 2 includes the the micro-LED chips in a form of a matrix of 32 rows and 64 columns (i.e., a pixel matrix of 32 rows and 64 columns). It should be noted that the micro-LED chips illustrated in FIG. 3 is a pixel matrix of only 3 rows and 4 columns.

Referring specifically to FIG. 3, adjacent two of the micro-LED chips of each of the micro light-emitting matrices 22 are spaced apart from each other in the first direction (X) by a first spacing distance ($d_1$), which ranges from 20 μm to 100 μm. Adjacent two of the micro light-emitting matrices 22 of each of the micro light-emitting diode matrices 2 are spaced apart from each other in the second direction (Y) by a second spacing distance ($d_2$), which ranges from 20 μm to 100 μm. In the first embodiment, each of the first and second spacing distances ($d_1$, $d_2$) is 50 μm.

Figure 5:
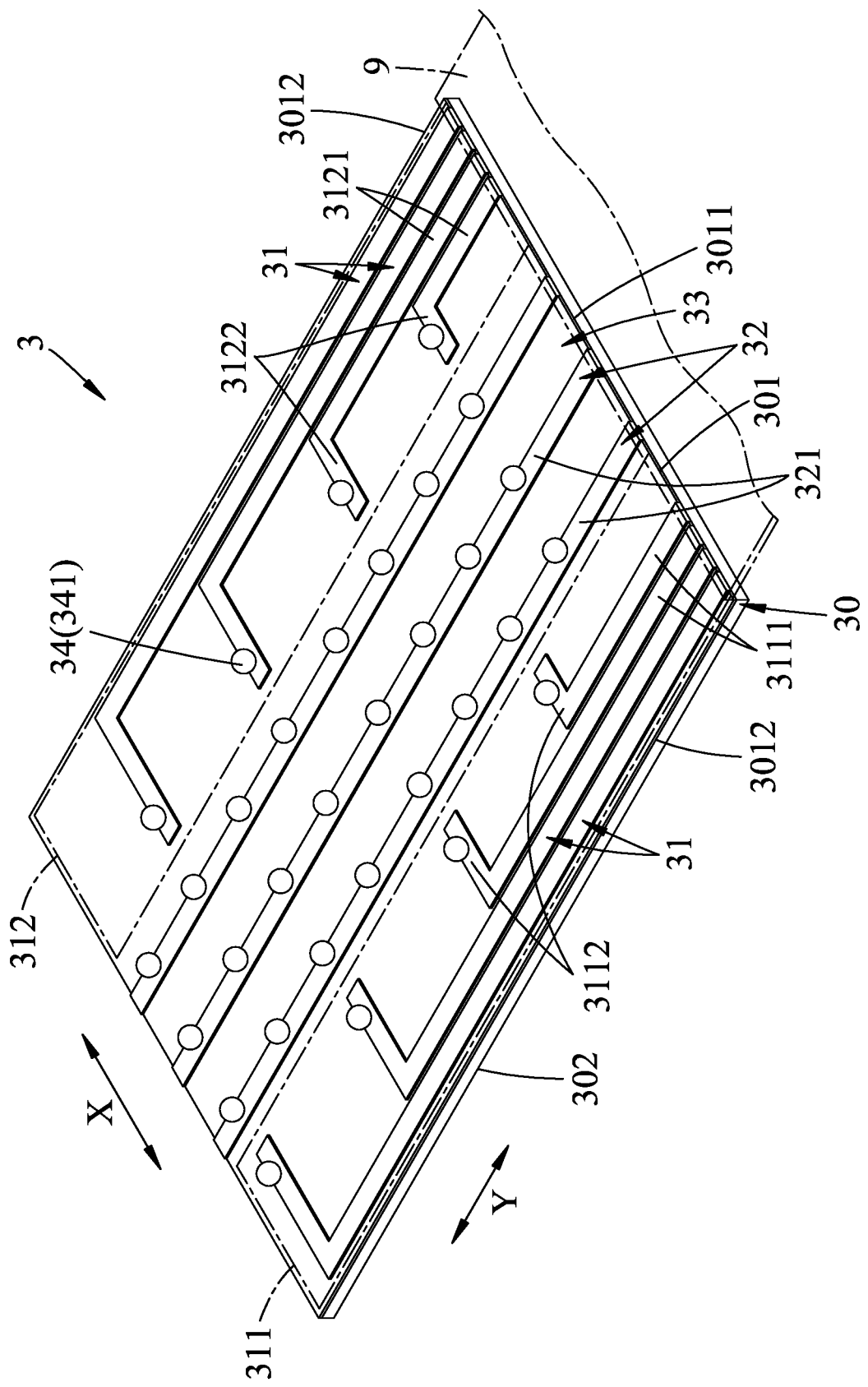
FIG. 5 is a perspective view of an external circuit component included in the first embodiment of the large area passive micro light-emitting diode matrix device according to the disclosure.
Figure 6:
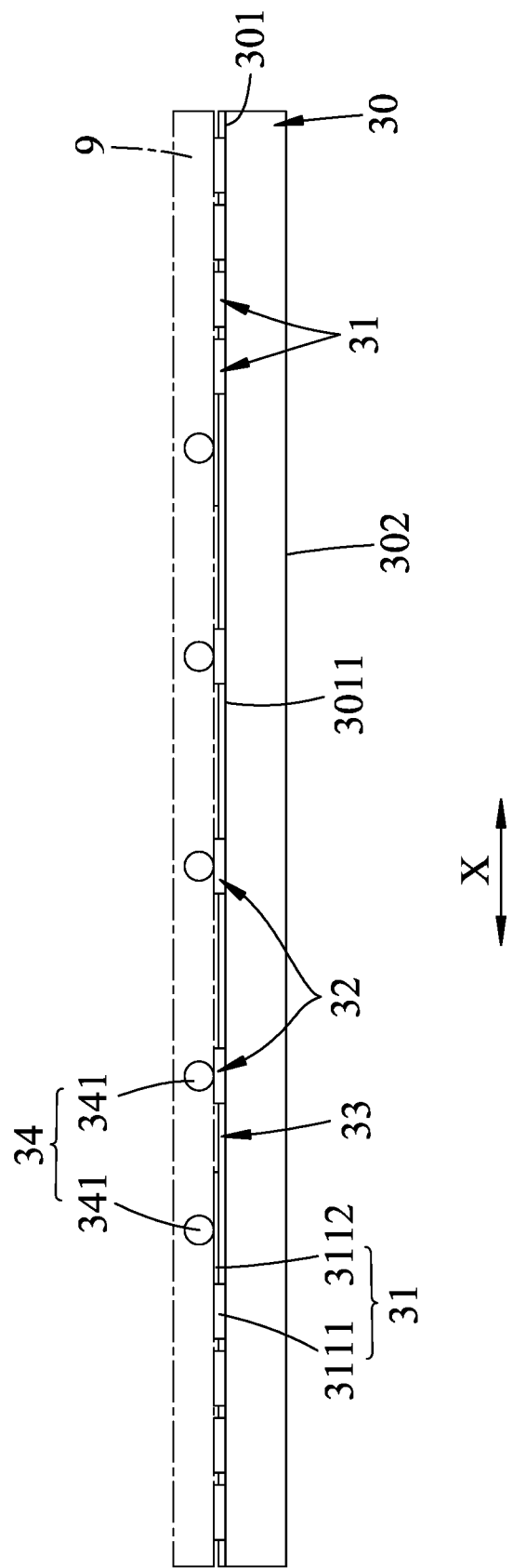
FIG. 6 is a schematic front view of the external circuit component of FIG. 5.

Referring specifically to FIGS. 5 and 6, the external circuit component 3 includes a carrier 30, a plurality of first external circuits 31, a plurality of second external circuits 32, a second insulation layer 33, and an electrical bonding unit 34. The first and second external circuits 31, 32 are adapted to bond the printed circuit board 9.

The carrier 30 includes a first surface 301 and a second surface 302 opposite to the first surface 301. The first surface 301 has a first side edge 3011 extending in the first direction (X) and a second side edge 3012 extending in the second direction (Y), and includes a first circuit-mounting region 311 and a second circuit-mounting region 312 opposite to each other in the first direction (X).

The first external circuits 31 are spaced apart from each other and are divided into a first group of the first external circuits 31 and a second group of the first external circuits 31 mounted on the first circuit-mounting region 311 and the second circuit-mounting region 312 of the first surface 301 of the carrier 30, respectively. Each of the first external circuits 31 includes a first extending segment 3111, 3121 extending in the second direction (Y). Each of the first group of the first external circuits 31 exclusive of an innermost one of the first group of the first external circuits 31 proximate to the second group of the first external circuits 31 further includes a second extending segment 3112 extending in the first direction (X) from an end portion of the first extending segment 311 thereof distal from the first side edge 3011 of the first surface 301 of the carrier 30. Each of the second group of the first external circuits 31 exclusive of an innermost one of the second group of the first external circuits 31 proximate to the first group of the first external circuits 31 further includes a second extending segment 3122 extending in the first direction (X) from an end portion of the first extending segment 3121 thereof distal from the first side edge 3011 of the first surface 301 of the carrier 30.

The second external circuits 32 are mounted above the first surface 301 of the carrier 30, are spaced apart from each other in the first direction (X), extend in the second direction (Y), and are disposed between the first extending segments 3111 of the first group of the first external circuits 31 and the first extending segments 3121 of the second group of the first external circuits 31. Each of the second external circuits 32 includes an extending segment 321 extending in the second direction (Y).

In the first embodiment, the innermost one of the first group of the first external circuits 31 further includes a second extending segment 3112 extending in the first direction (X) from an end portion of the first extending segment 3111 thereof distal from the first side edge 3011 of the first surface 301 of the carrier 30. The innermost one of the second group of the first external circuits 31 further includes a second extending segment 3122 extending in the first direction (X) from an end portion of the first extending segment 3121 thereof distal from the first side edge 3011 of the first surface 301 of the carrier 30.

Specifically, as shown in FIG. 5, in the external circuit component 3, each of the first external circuits 31 includes the first extending segment 3111, 3121 and the second extending segment 3112, 3122. It should be noted that the innermost one of the first group of the first external circuits 31 and the innermost one of the second group of the first external circuits 31 may only be configured by the first extending segments 3111, 3121, respectively.

The second insulation layer 33 covers the first surface 301 of the carrier 30 to permit the first and second external circuits 31, 32 to be exposed from the second insulation layer 33.

The electrical bonding unit 34 is disposed on the first and second external circuits 31, 32 that are exposed from the second insulation layer 33.

In the first embodiment, the carrier is, for example, a glass substrate. The second insulation layer 33 is made of Su-8 photoresist, silica, or alumina. The first external circuits 31 is made of Mo or Al. The second external circuits 32 is made of Au, Ag, Al, Ag, Cu, or Ti. Specifically, the first and second external circuits 31, 32 are mounted directly on the first surface 301 of the carrier 30, and the first extending segments 3111, 3121 of the first external circuits 31 and the extending segments 321 of the second external circuits 32 are electrically bonded to the printed circuit board 9 at the first side edge 3011 of the first surface 301 of the carrier 30.

Figure 7:
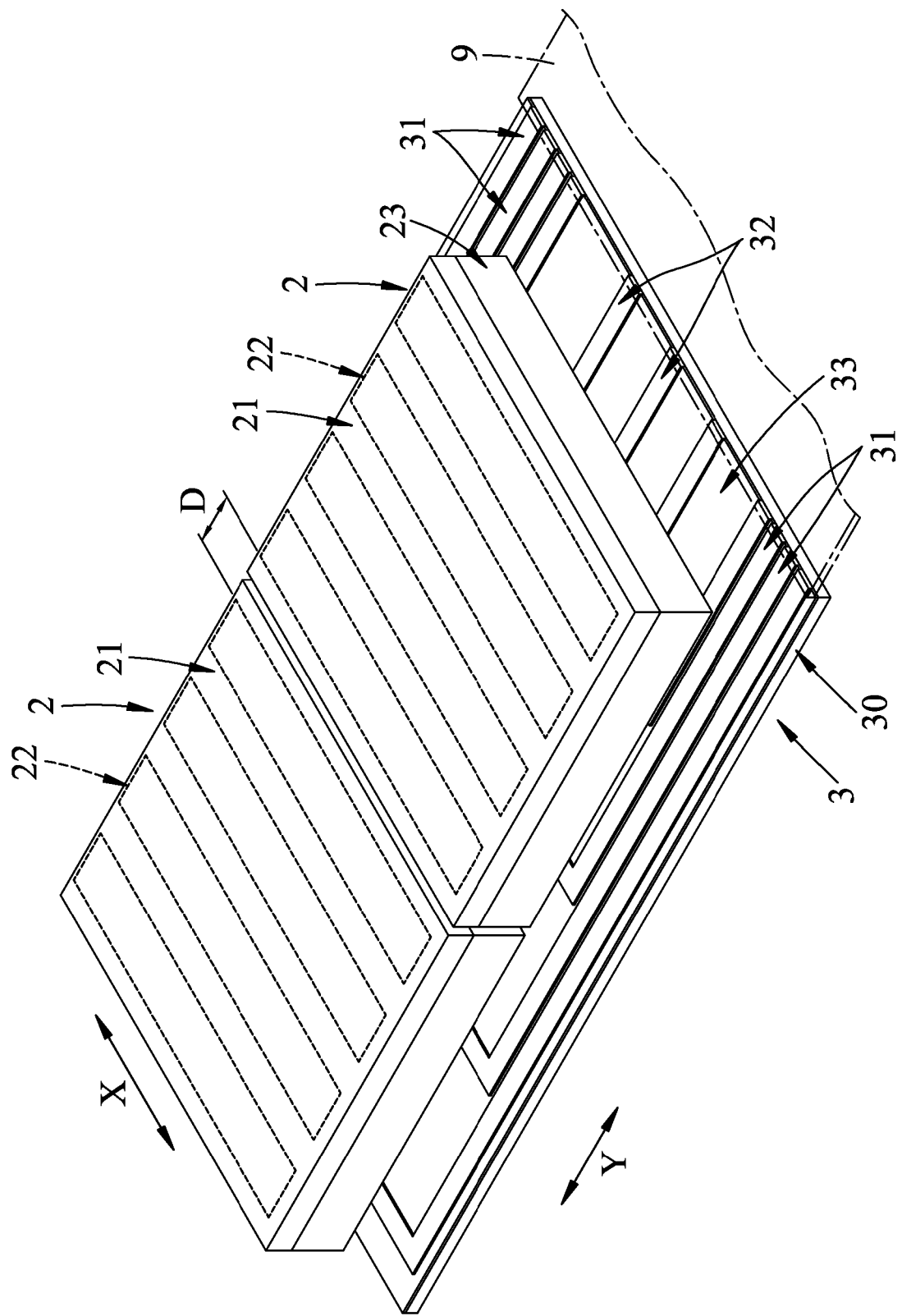
FIG. 7 is a perspective view of the first embodiment of the large area passive micro light-emitting diode matrix device according to the disclosure.
Figure 8:
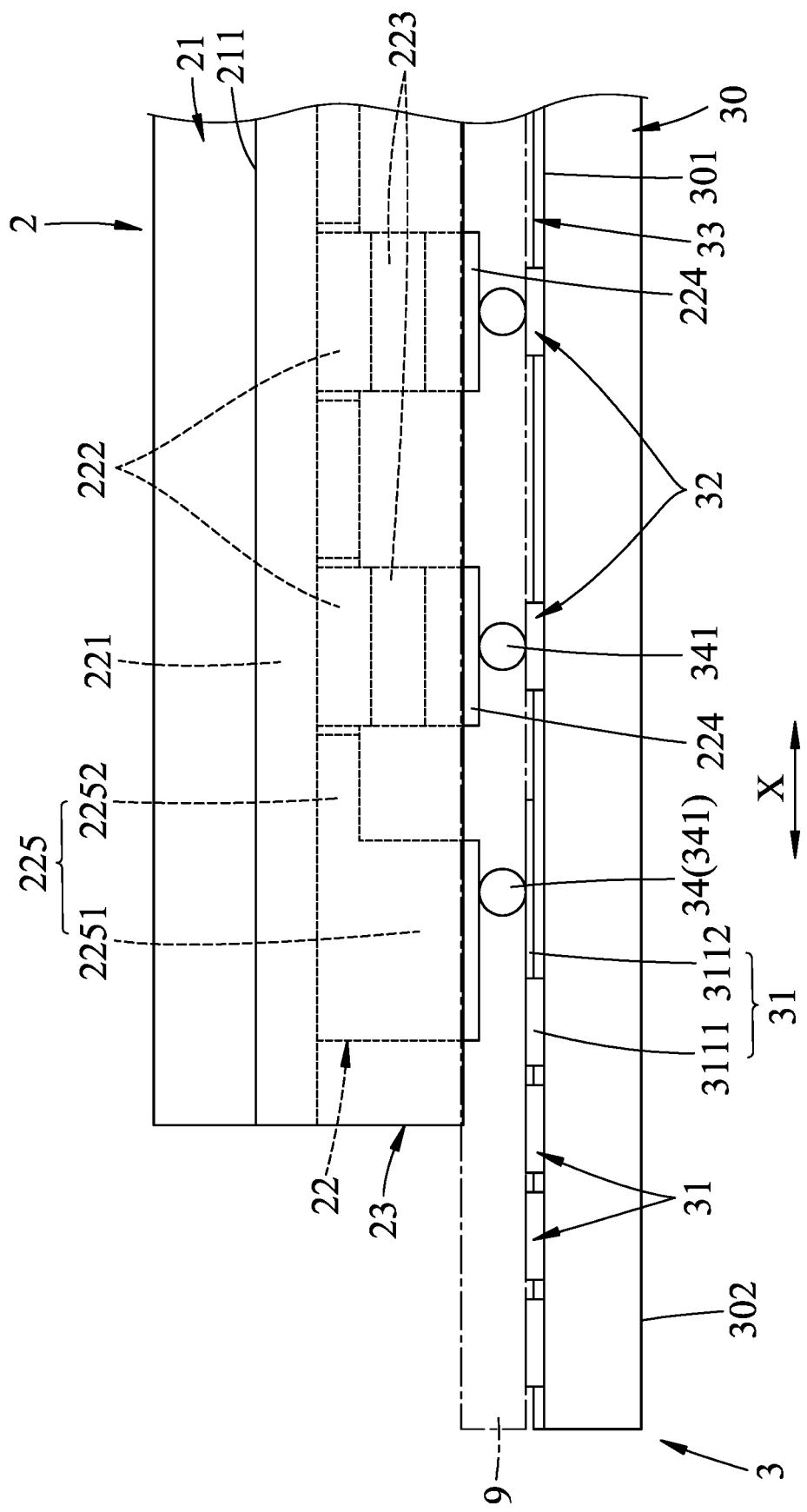
FIG. 8 is a fragmentary schematic front view of the first embodiment of the large area passive micro light-emitting diode matrix device according to the disclosure.
Figure 9:
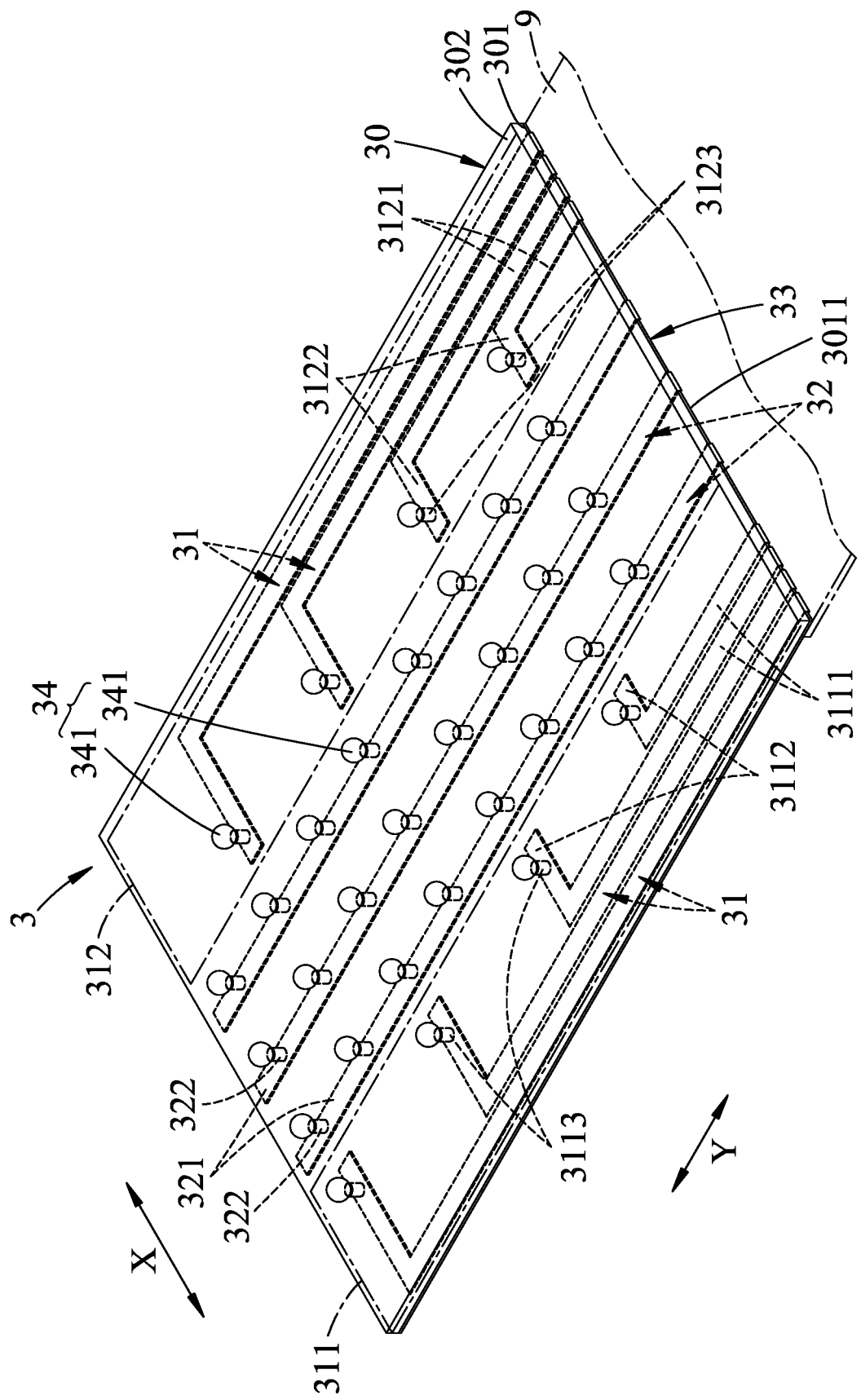
FIG. 9 is a perspective view of an external circuit component included in a second embodiment of the large area passive micro light-emitting diode matrix device according to the disclosure.
Figure 10:
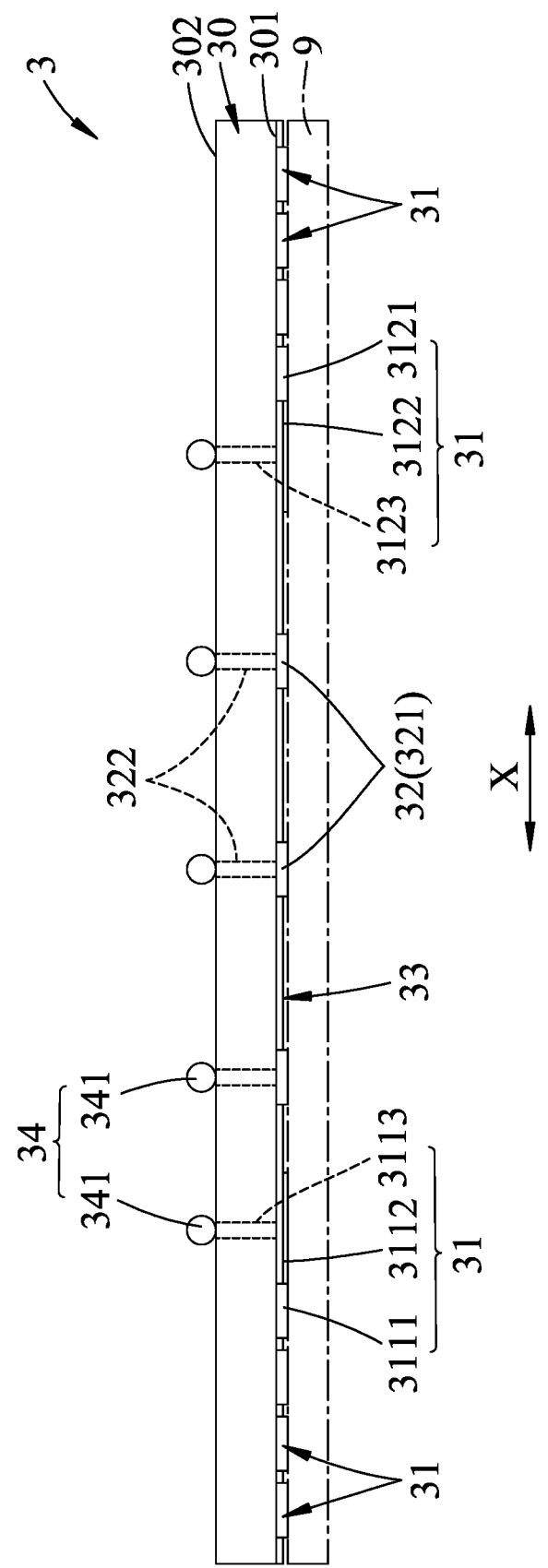
FIG. 10 is a schematic front view of the external circuit component of FIG. 9.

Referring specifically to FIGS. 7 and 8, the micro light-emitting diode matrices 2 are disposed on the external circuit component 3, and are proximate to and spaced apart from one another so as to permit the first portion 2251 of the second inner electrode layer 225 and the first inner electrode layers 224 of each of the micro light-emitting matrices 22 of each of the micro light-emitting diode matrices 2 to electrically bond the electrical bonding unit 34 of the external circuit component 3.

The adjacent two of the micro light-emitting matrices 22 disposed respectively on the adjacent two of the micro light-emitting diode matrices 2 are spaced from each other in the second direction (Y) by a third spacing distance (D) which ranges from 20 µm to 3000 µm.

In certain embodiments, a ratio of the third spacing distance (D) to the first, spacing distance ($d_1$) ranges from 1 to 150, and a ratio of the third spacing distance (D) to the second spacing distance ($d_2$) ranges from 1 to 150. In certain embodiments, the ratio of the third spacing distance (D) to the first spacing distance ($d_1$) ranges from 1 to 100, and the ratio of the third spacing distance (D) to the second spacing distance ($d_2$) ranges from 1 to 100. In certain embodiments, the ratio of the third spacing distance (D) to the first spacing distance (d1) ranges from 1 to 50, and the ratio of the third spacing distance (D) to the second spacing distance (d2) ranges from 1 to 50. In the first embodiment, the third spacing distance (D) is 1000 µm, and both the ratio of the third spacing distance (D) to the first spacing distance (d1) and the ratio of the third spacing distance (D) to the second spacing distance (d2) are 20.

The electrical bonding unit 34 is a conductive component selected from the group consisting of an anisotropic conductive film, a ball grid array, bumps, strips, and combinations thereof.

Referring specifically to FIGS. 5, 7, and 8, the electrical bonding unit 34 of the external circuit component 3 is disposed on the second extending segments 3112, 3122 of the first external circuits 31 and the extending segments 321 of the second external circuits 32. In the first embodiment, the electrical bonding unit 34 is illustrated as the ball grid array, which includes an array of solder balls 341. It should be noted that as described above, the electrical bonding unit 34 maybe an anisotropic conductive film, bumps, strips, or the like.

Referring specifically to FIG. 7, although the first embodiment of the large area passive micro light-emitting diode matrix display according to the disclosure is illustrated as two of the micro light-emitting diode matrices 2, the number of the light-emitting diode matrices 2 disposed on the external circuit component 3 may be increased when the lengths of the first extending segments 3111, 3121 of the first external circuits 31 and the lengths of the extending segments 321 of the second external circuits 32 are increased.

In the large area passive micro light-emitting diode matrix display according to the disclosure, since the external circuit component 3 is provided to permit the micro light-emitting diode matrices 2 to be electrically connected to the printed circuit board 9, it is not necessary to compromise a certain area of the matrix-mounting surface 211 of the substrate 21 for forming a circuit to be electrically connected to the printed circuit board. Therefore, the matrix-mounting surface 211 of the substrate 21 can be used more effectively for forming LED chips thereon, and the distances between the LED chips proximate to a corresponding one of the first and second side edges 2111, 2112 and the corresponding one of the first and second side edges 2111, 2112 can be reduced. Furthermore, as described above, both the first and second spacing distances (d1, d2) may be as small as 50 µm, and the third spacing distance (D) may be as small as 1000 µm. The overall visual effect of the image presented by the large area passive micro light-emitting diode matrix display according to the disclosure can be significantly enhanced, and the third spacing distance (D) can be substantially ignored.

It should be noted that after the large area passive micro light-emitting diode matrix display is manufactured, the micro light-emitting diode matrices 2 may be electrically tested before being electrically bonded to the external circuit component 3 to ensure that the LED chips of the micro light-emitting matrices 22 of each of the micro light-emitting diode matrices 2 can be operated normally and emit light. Therefore, the problems of the prior art, such as the undesirable increase in production cost and the unsatisfactory image resolution can be overcome.

In addition, the image displayed by the large area passive micro light-emitting diode matrix display according to the disclosure is driven by the external driver chip (not shown) that is electrically bonded to the printed circuit board 9, and the external driver chip is used for controlling the first and second external circuits 31, 32, so that the LED chips is controlled to display the image. The large area passive micro light-emitting diode matrix display according the disclosure is also suitably used as a display panel for various smart household appliances.

Referring to FIGS. 8 to 12, a second embodiment of the large area passive micro light-emitting diode matrix display according to the disclosure is similar to the first embodiment, except as follows.

Each of the first external circuits 31 further includes at least one inner connecting segment 3113, 3123 extending from the second extending segment 3112, 3122 thereof and through the first surface 301 of the carrier 30 to be exposed from the second surface 302 of said carrier 30.

Each of the second external circuits 32 further includes a plurality of inner connecting segments 322 which are disposed on the extending segment 321 thereof, which are spaced apart from each other in the second direction (Y), and which extend through the first surface 301 of the carrier 30 to be exposed from the second surface 302 of the carrier 30.

The electrical bonding unit 34 of the external circuit component 3 is disposed on the inner connecting segments 3113, 3123 of the first external circuits 31 and the inner connecting segments 322 of the second external circuits 32. Therefore, the micro light-emitting diode matrices 2 are disposed on the second surface 302 of the external circuit component 3, and are proximate to and spaced apart from one another in the second direction (Y).

In terms of the process for manufacturing the large area passive micro light-emitting diode matrix display according to the disclosure, the first embodiment may be manufactured by electrically bonding the micro light-emitting diode matrices 2 to the external circuit component 3, followed by electrically bonding the printed circuit board 9 to the first and second external circuits 31, 32 of the external circuit component 3. The second embodiment may be manufactured relatively flexibly as compared to the first embodiment.

Figure 11:
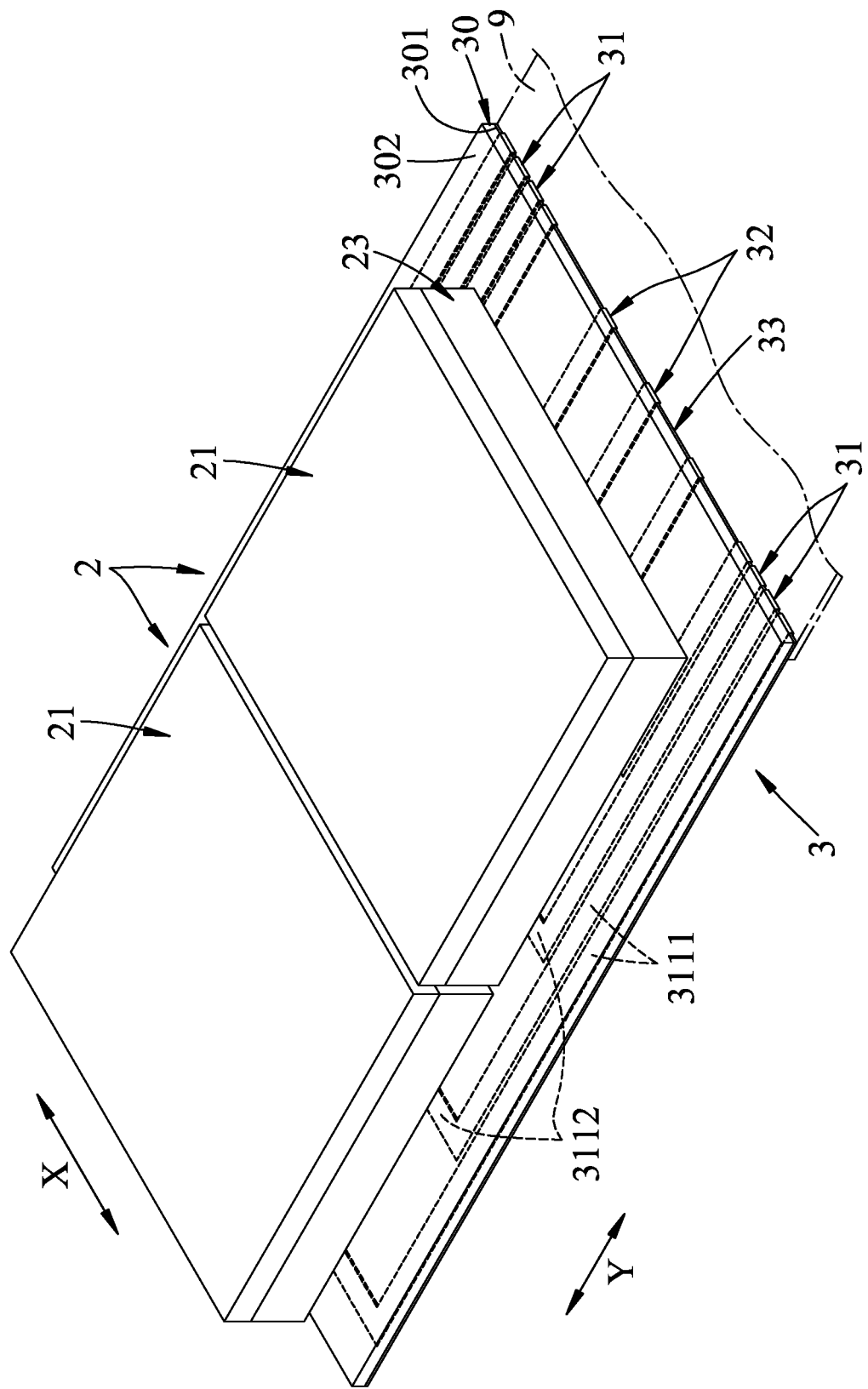
FIG. 11 is a perspective view of the second embodiment of the large area passive micro light-emitting diode matrix device according to the disclosure.
Figure 12:
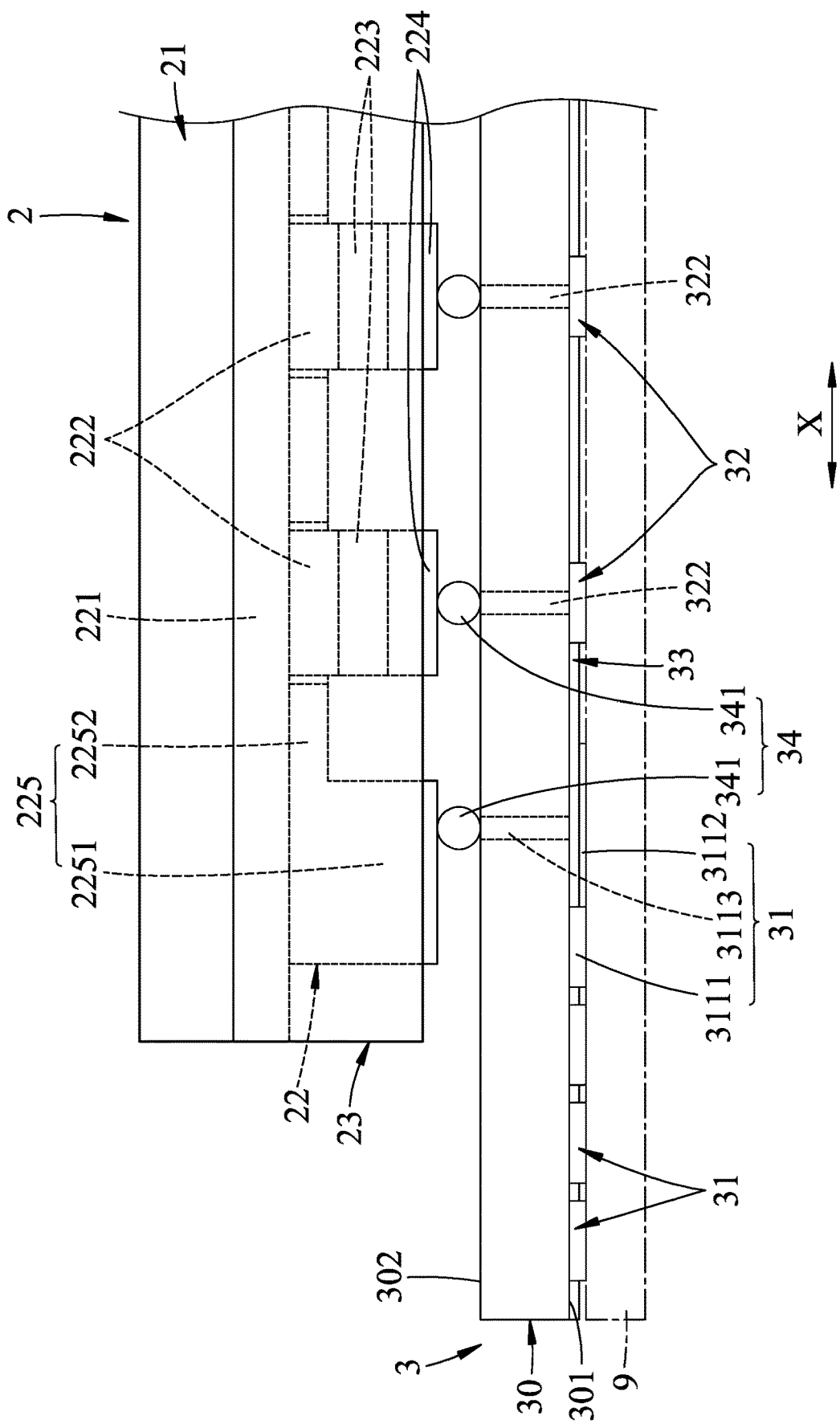
FIG. 12 is a fragmentary schematic front view of the second embodiment of the large area passive micro light-emitting diode matrix device according to the disclosure.

Specifically, referring to FIGS. 11 and 12, the process for manufacturing the second embodiment includes procedure a) or electrically bonding the printed circuit board 9 to the first extending segments 3111, 3121 of the first external circuits 31 and the extending segments 321 of the second external circuits 32 of the external circuit component 3, and procedure b) of electrically bonding the light-emitting diode matrices 2 to the inner connecting segments 3113, 3123 of the first external circuits 31 and the inner connecting segments 322 of the second external circuits 32 via the solder balls 341 of the electrical bonding unit 34. The first extending segments 3111, 3121 of the first external circuits 31 and the extending segments 321 of the second external circuits 32 are mounted on the first surface 301 of the carrier 30, and the solder balls 341 are disposed on the inner connecting segments 3113, 3123, 322 which are exposed from the second surface 302 of the carrier 30. Therefore, procedure a) may be implemented before or after procedure b).

Referring to FIGS. 13 to 18, a third embodiment of the large area passive micro light-emitting diode matrix display according to the disclosure is similar to the first embodiment, except as follows.

Figure 13:
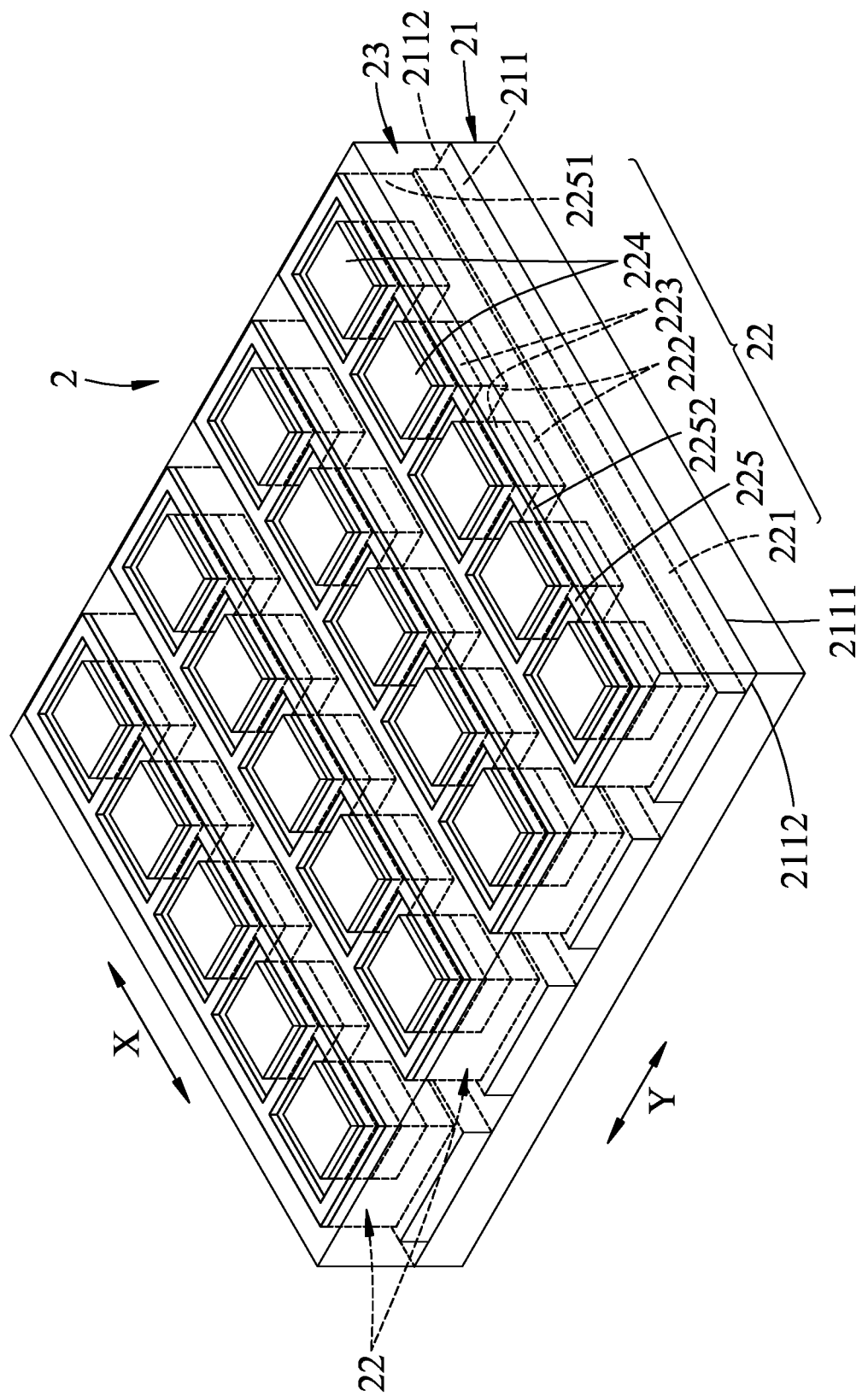
FIG. 13 is a perspective view of a micro light-emitting diode matrix included in a third embodiment of the large area passive micro light-emitting diode matrix device according to the disclosure.
Figure 14:
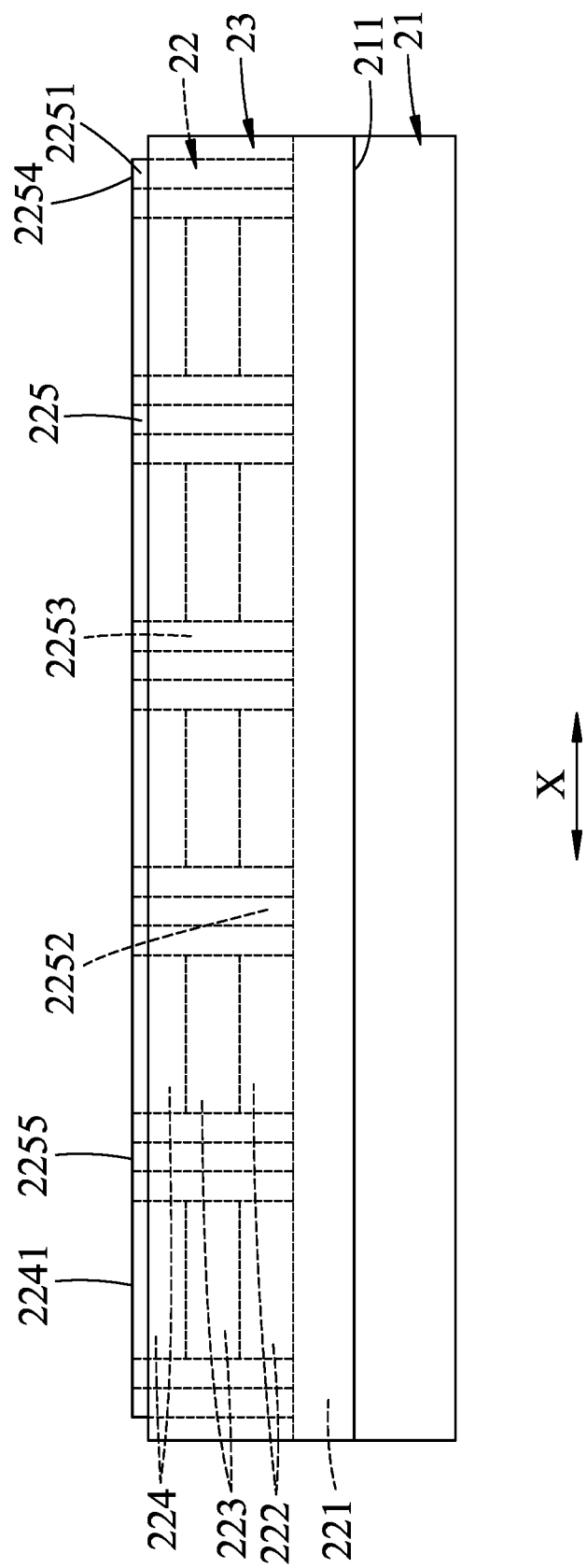
FIG. 14 is a schematic front view of the micro light-emitting diode matrix of FIG. 13.

Referring specifically to FIGS. 13 and 14, the top surface 2255 of the second portion 2252 of the second inner electrode layer 225 is flush with the top surface 2254 of the first portion 2251 of the second inner electrode layer 225, and the top surface 2241 of each of the first inner electrode layers 224 is flush with the top surface 2254 of the first portion 2251 of the second inner electrode layer 225.

Figure 15:
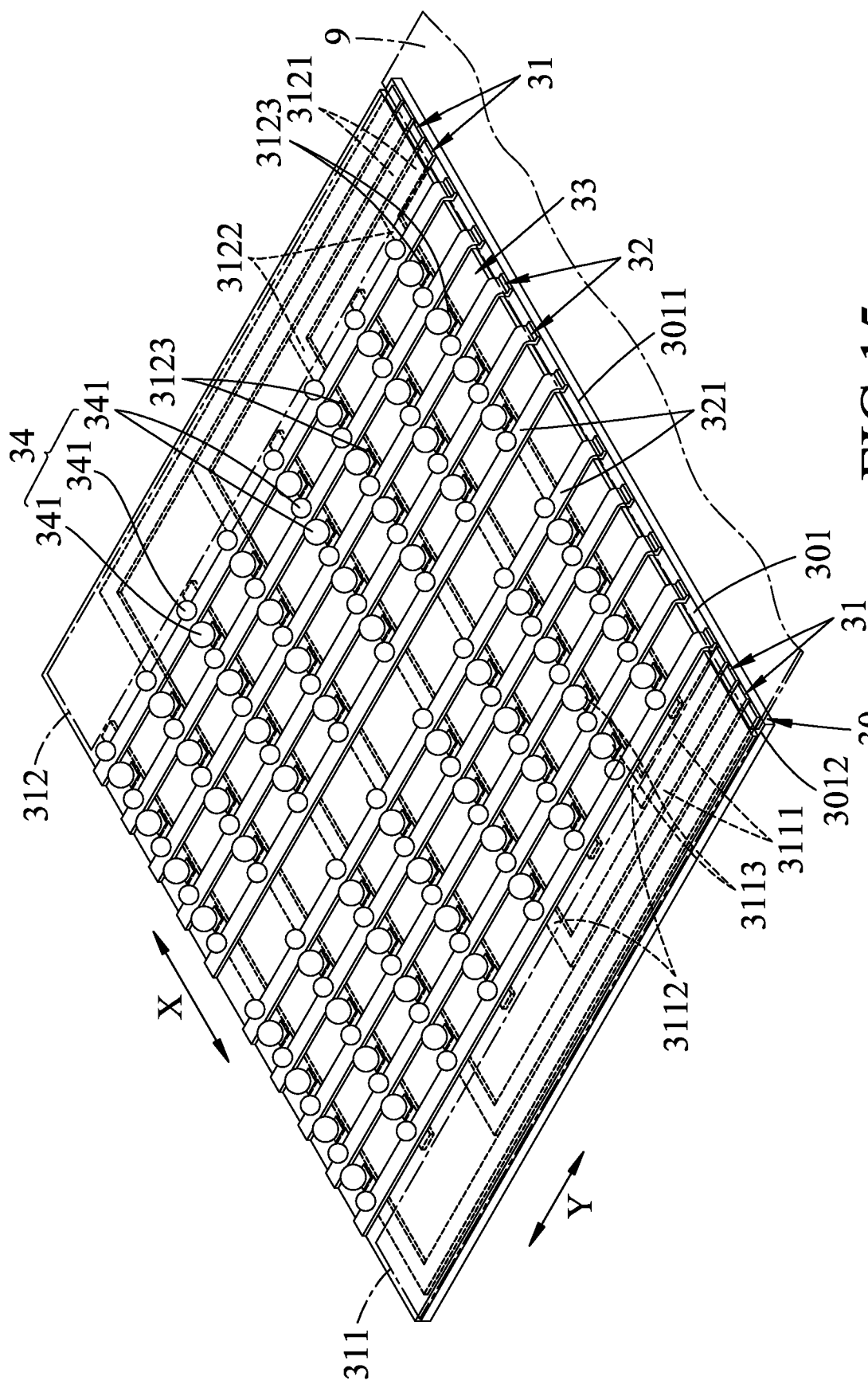
FIG. 15 is a perspective view of an external circuit component included in the third embodiment of the large area passive micro light-emitting diode matrix device according to the disclosure.
Figure 16:
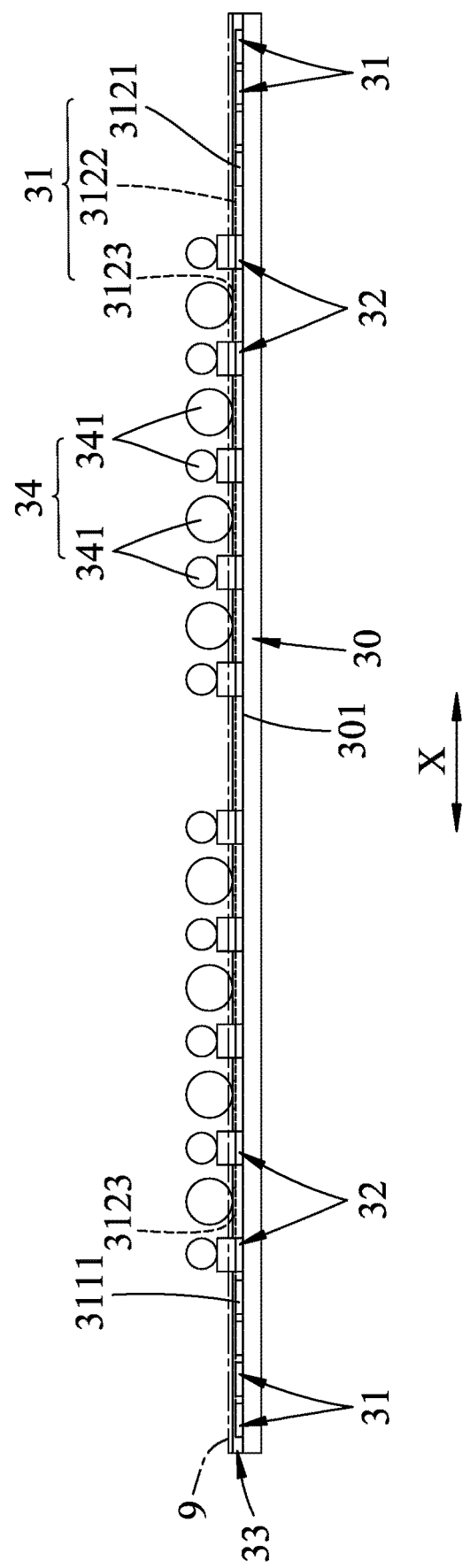
FIG. 16 is a schematic front view of the external circuit component of FIG. 15.

Specifically referring to FIGS. 15 and 16, the first external circuits 31 are disposed directly on the first surface 301 of the carrier 30, and each of the first external circuits 31 further includes a plurality of inner connecting segments 3113, 3123.

The second insulation layer 33 covers the second extending segments 3112, 3122 of the first external circuits 31.

The second eternal circuits 32 span across the second extending segments 3112, 3122 of the first external circuits 31 to permit the second eternal circuits 32 to be isolated from the second extending segments 3112, 3122 of the first external circuits 31 by the second insulation layer 33.

The inner connecting segments 3113, 3123 of each of the first external circuits 31 are disposed on the second extending segment 3112, 3122 of said each of the first external circuits 31 and spaced apart from each other in the first direction (X), and extend through and are exposed from the second insulation layer 33.

Figure 17:
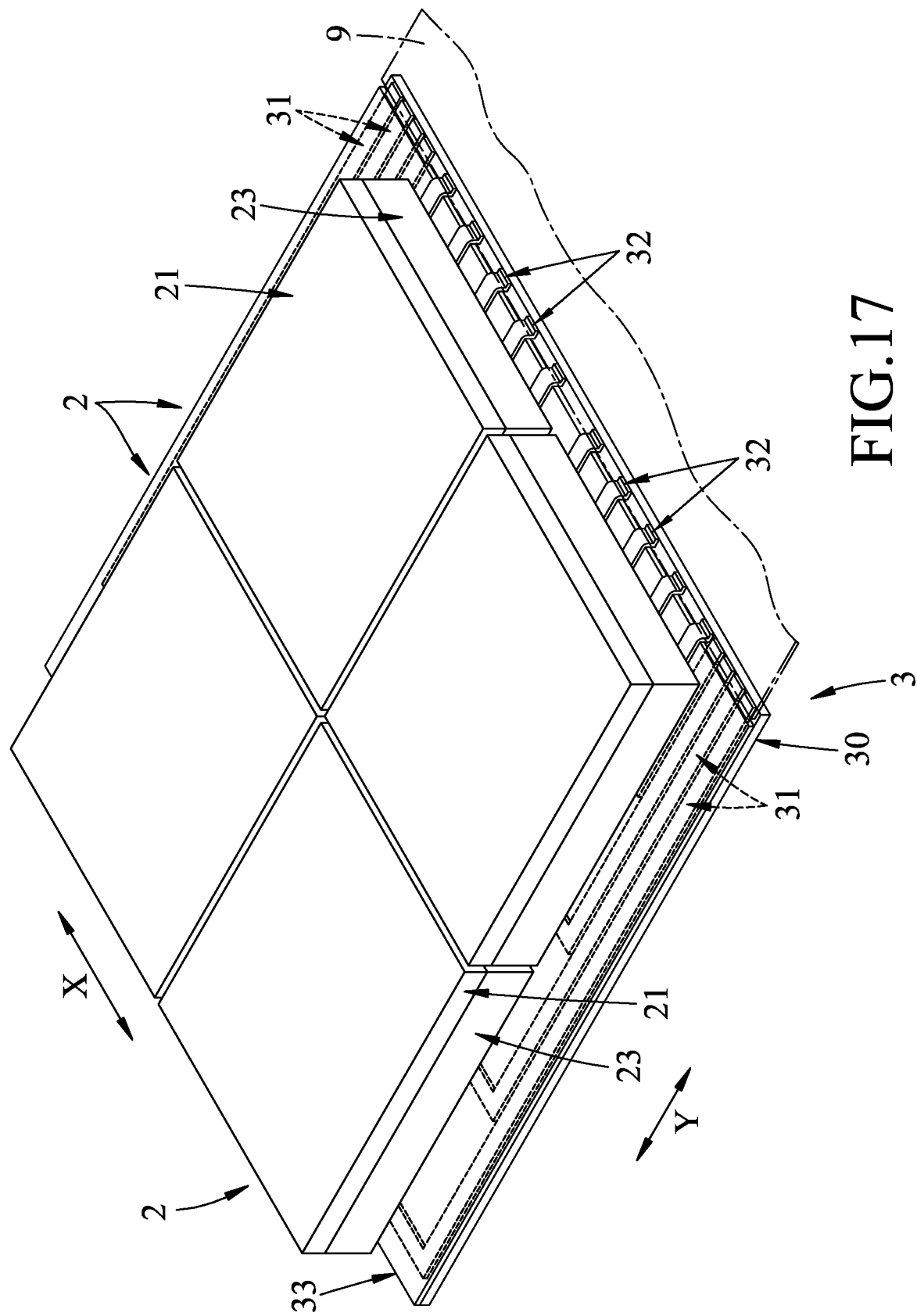
FIG. 17 is a perspective view of the third embodiment of the large area passive micro light-emitting diode matrix device according to the disclosure.
Figure 18:
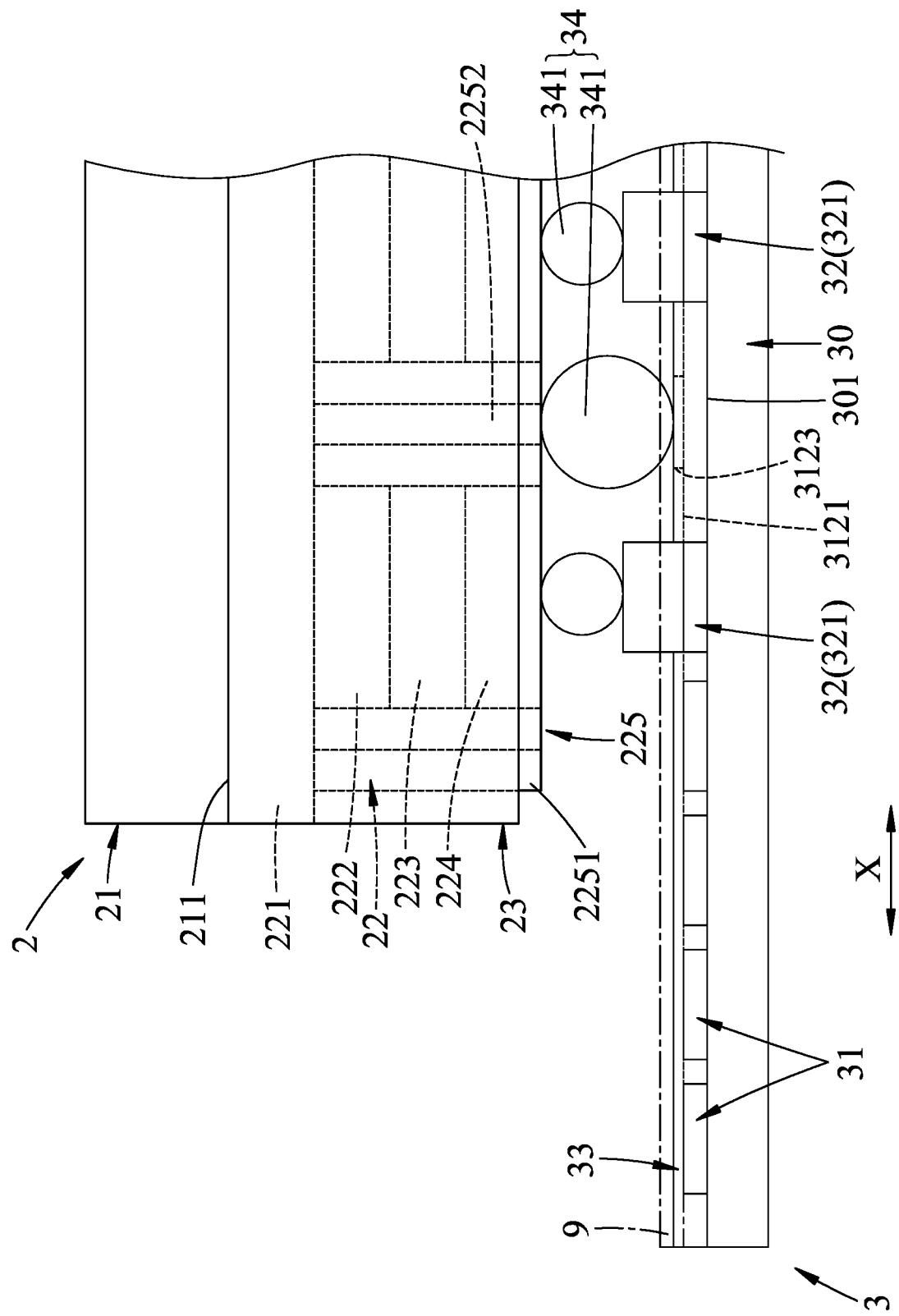
FIG. 18 is a fragmentary schematic front view of the third embodiment of the large area passive micro light-emitting diode matrix device according to the disclosure.

Specifically referring to FIGS. 15, 17, and 18, the electrical bonding unit 34 of the external circuit component 3 is disposed on the inner connecting segments 3113, 3123 of the first external circuits 31 and the extending segments 321 of the second external circuits 32.

Referring specifically to FIG. 17, although the third embodiment of the large area passive micro light-emitting diode matrix display according to the disclosure is illustrated as the micro light-emitting diode matrices 2 in an array of 2 columns and 2 rows, the numbers of the column and row of the array of the light-emitting diode matrices 2 may be increased when the carrier 30 of the external circuit component 3 has an area that is sufficient for disposing the required number of the first and second external circuits 31, 32. Therefore, the third embodiment can be used to display an image larger than that displayed by the first embodiment.

Referring to FIGS. 19 to 22, a fourth embodiment of the large area passive micro light-emitting diode matrix display according to the disclosure is similar to the second and third embodiments, except as follows.

Figure 19:
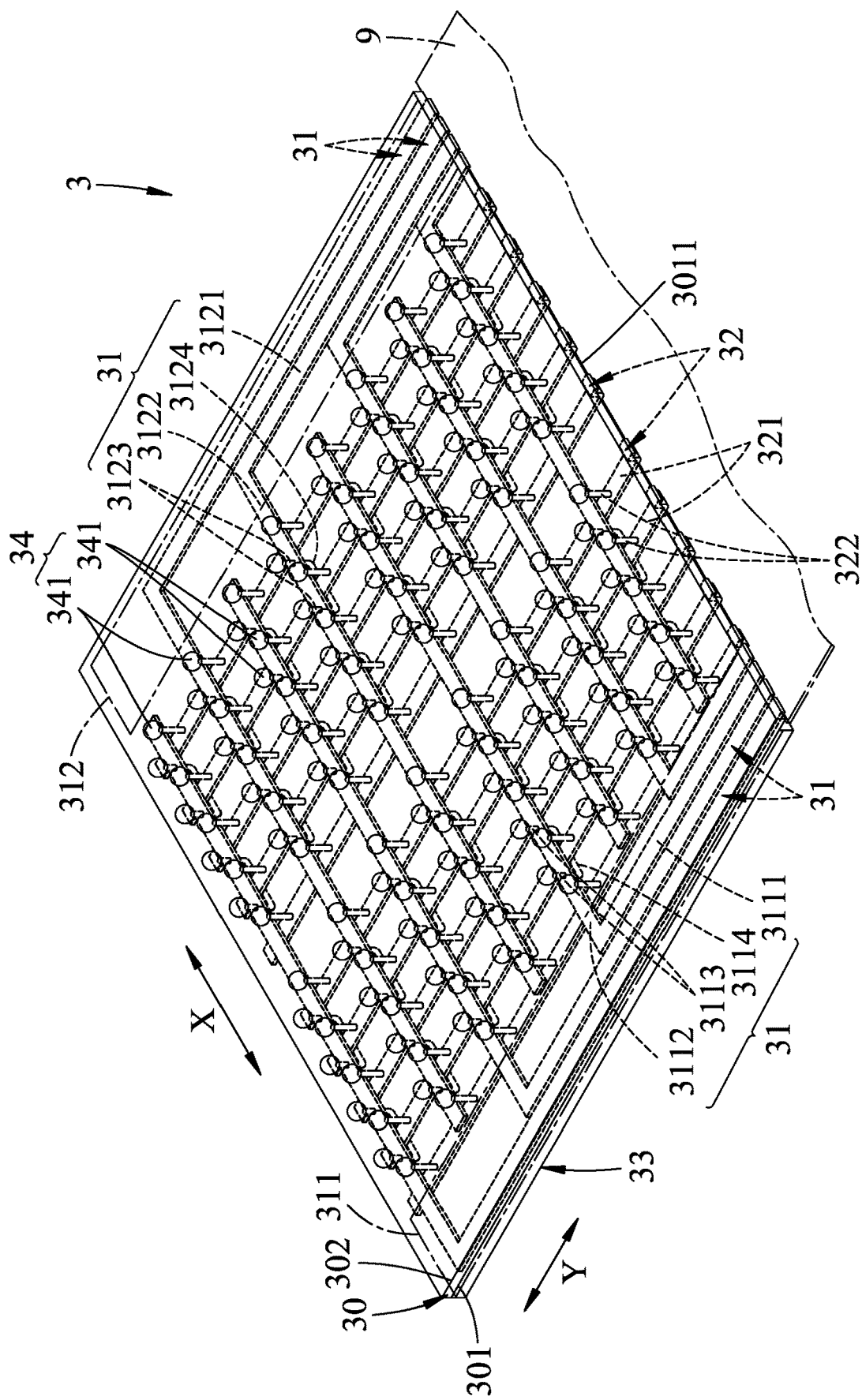
FIG. 19 is a perspective view of an external circuit component included in a fourth embodiment of the large area passive micro light-emitting diode matrix device according to the disclosure.
Figure 20:
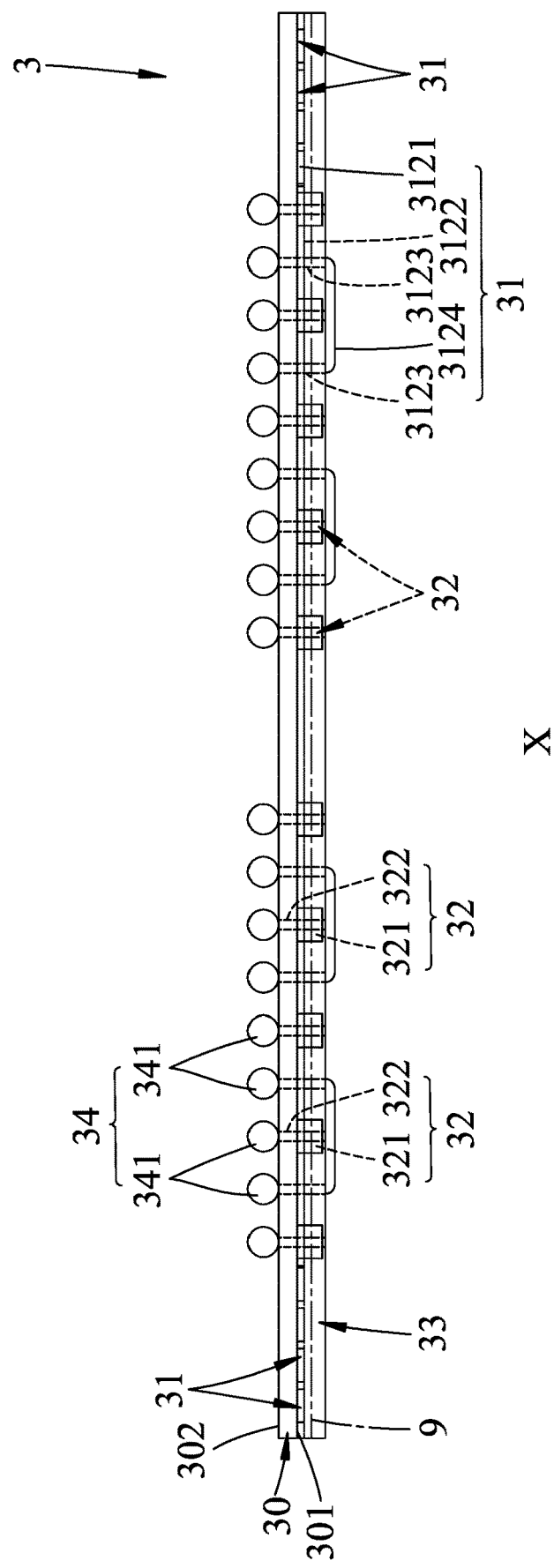
FIG. 20 is a schematic front view of the external circuit component of FIG. 19.
Figure 21:
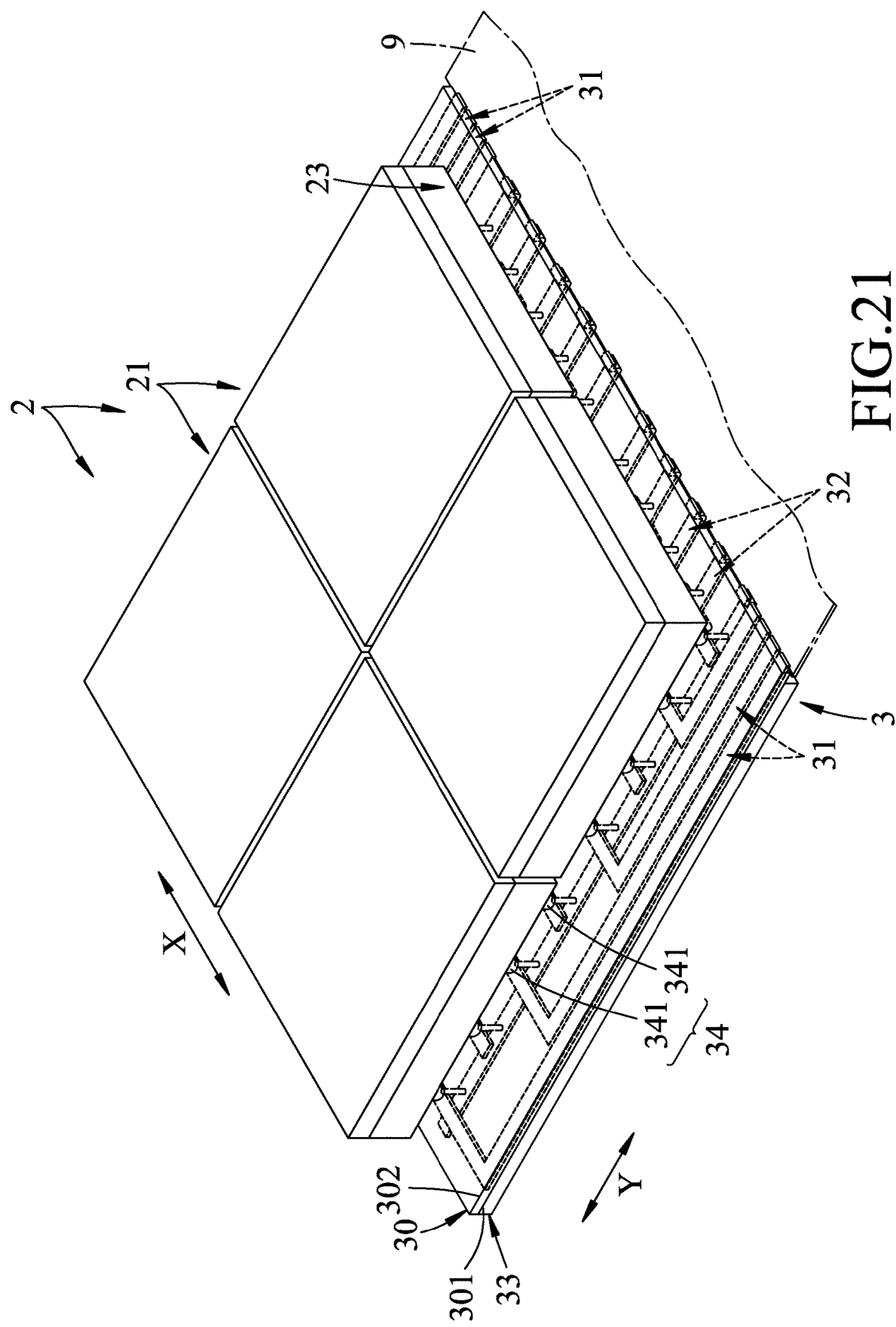
FIG. 21 is a perspective view of the fourth embodiment of the large area passive micro light-emitting diode matrix device according to the disclosure.
Figure 22:
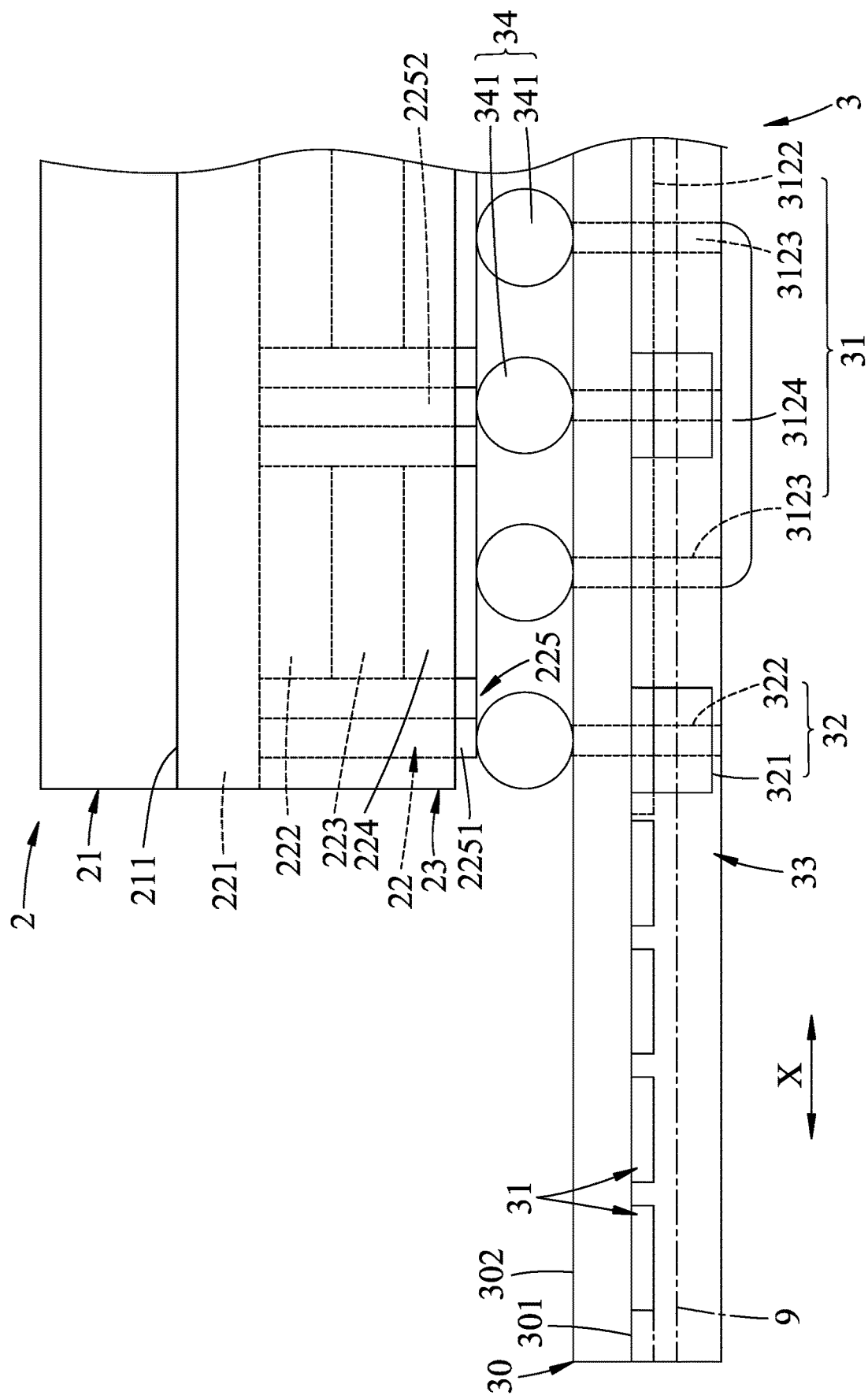
FIG. 22 is a fragmentary schematic front view of the fourth embodiment of the large area passive micro light-emitting diode matrix device according to the disclosure.

Referring specifically to FIGS. 19 and 20, the first external circuits 31 are disposed directly on the first surface 301 of the carrier 30, and each of the first external circuits 31 includes a plurality of the inner connecting segments 3113, 3123 and a plurality of bridging segments 3114, 3124.

The second insulation layer 33 covers the second extending segments 3112, 3122 of the first external circuits 31 and the extending segments 321 of the second external circuits 32 to permit an end portion of each of the extending segments 321 of the second external circuits 32 proximate to the first side edge 3011 of the first surface 301 of the carrier 30 to be exposed from the second insulation layer 33.

The second eternal circuits 32 span across the second extending segments 3112, 3122 of the first external circuits 31, and includes a plurality of the inner connecting segments 322.

Specifically, the inner connecting segments 3113, 3123 of each of the first external circuits 31 are disposed on the second extending segment. 3112, 3122 of said each of the first external circuits 31 and spaced apart from each other in the first direction (X), and extend from the second extending segment 3112, 3122 of said each of the first external circuits 31 and through the first surface 301 of the carrier 30 to be exposed from the second surface 302 of the carrier 30.

The bridging segments 3114, 3124 of each of the first external circuits 31 are disposed on the second extending segment 3112, 3122 of said each of the first external circuits 31, spaced apart from each other in the first direction (X), and partially (as illustrated in FIGS. 19 and 20) or totally embedded in the second insulation layer 33 to permit each of the bridging segments 3114, 3124 of each of the first external circuits 31 to span across the extending segment 321 of a corresponding one of the second external circuits 32 and to be connected to corresponding two of the inner connecting segments 3113, 3123 of said each of the first external circuits 31.

The inner connecting segments 322 of each of the second external circuits 32 are disposed on the extending segment 321 of said each of the second external circuits 32 and spaced apart from each other in the second direction (Y) to permit each of the inner connecting segments 322 of each of the second external circuits 32 to be spaced apart from the second extending segment 3112, 3122 of a corresponding one of the first external circuits 31, and to extend through the second insulation layer 33 and the first surface 301 of the carrier 30 to be exposed from the second surface 302 of the carrier 30.

The electrical bonding unit 34 of the external circuit component 3 is disposed on the inner connecting segments 3113, 3123 of the first external circuits 31 and the inner connecting segments 322 of the second external circuits 32.

Similar to the second embodiment, in the fourth embodiment, the first extending segments 3111, 3121 of the first external circuits 31 and the extending segments 321 of the second external circuits 32 are mounted on the first surface 301 of the carrier 30, and the solder balls 341 are disposed on the inner connecting segments 3113, 3123, 322 which are exposed from the second surface 302 of the carrier 30. Therefore, the fourth embodiment can be manufactured relatively flexibly.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A large area passive micro light-emitting diode matrix display, comprising:
    a plurality of micro light-emitting diode matrices, each including:
        a substrate having a matrix-mounting surface, which has a first side edge extending in a first direction and a second side edge extending in a second direction transverse to the first direction,
        a plurality of micro light-emitting matrices mounted on said matrix-mounting surface and spaced apart from each other in the second direction, each of said micro light-emitting matrices including
            a first layer disposed on said matrix-mounting surface and extending in the first direction,
            a plurality of light-emitting layers disposed on said first layer and spaced apart from each other in the first direction,
            a plurality of second layers disposed on said light-emitting layers, respectively,
            a plurality of first inner electrode layers disposed on said second layers, respectively, and
            a second inner electrode layer which is disposed on said first layer, and which includes a first portion proximate to said second side edge of said matrix-mounting surface and a second portion extending from said first portion in the first direction and having a plurality of through holes to accommodate said light-emitting layers, respectively, and
        a first insulation layer covering said matrix-mounting surface to permit said micro light-emitting matrices to be partially embedded in said first insulation layer and to permit said first portion of said second inner electrode layer and said first inner electrode layers of each of said micro light-emitting matrices to be exposed from said first insulation layer; and
    an external circuit component including
        a carrier including
            a first surface having a first side edge extending in the first direction and a second side edge extending in the second direction, and including a first circuit-mounting region and a second circuit-mounting region opposite to each other in the first direction, and
            a second surface opposite to said first surface,
        a plurality of first external circuits which are spaced apart from each other and which are divided into a first group of said first external circuits and a second group of said first external circuits mounted on said first circuit-mounting region and said second circuit-mounting region of said first surface of said carrier, respectively, each of said first external circuits including a first extending segment extending in the second direction, each of the first group of said first external circuits exclusive of an innermost one of the first group of said first external circuits proximate to the second group of said first external circuits further including a second extending segment extending in the first direction from an end portion of said first extending segment thereof distal from said first side edge of said first surface of said carrier, each of the second group of said first external circuits exclusive of an innermost one of the second group of said first external circuits proximate to the first group of said first external circuits further including a second extending segment extending in the first direction from an end portion of said first extending segment thereof distal from said first side edge of said first surface of said carrier,
        a plurality of second external circuits mounted above said first surface of said carrier, spaced apart from each other in the first direction, extending in the second direction, and disposed between said first extending segments of the first group of said first external circuits and said first extending segments of the second group of said first external circuits, each of said second external circuits including an extending segment extending in the second direction,
        a second insulation layer covering said first surface of said carrier to permit said first and second external circuits to be exposed from said second insulation layer, and
        an electrical bonding unit disposed on said first and second external circuits that are exposed from said second insulation layer,
    wherein said micro light-emitting diode matrices are disposed on said external circuit component, and are proximate to and spaced apart from one another so as to permit said first portion of said second inner electrode layer and said first inner electrode layers of each of said micro light-emitting matrices of each of said micro light-emitting diode matrices to be electrically bonded to said electrical bonding unit of said external circuit component.

2. The large area passive micro light-emitting diode matrix display according to claim 1, wherein said innermost one of the first group of said first external circuits further includes a second extending segment extending in the first direction from an end portion of said first extending segment thereof distal from said first side edge of said first surface of said carrier, and said innermost one of the second group of said first external circuits further includes a second extending segment extending in the first direction from an end portion of said first extending segment thereof distal from said first side edge of said first surface of said carrier.

3. The large area passive micro light-emitting diode matrix display according to claim 2, wherein said first portion of said second inner electrode layer has a top surface, said second portion of said second inner electrode layer has a top surface lower than said top surface of said first portion of said second inner electrode layer, and each of said first inner electrode layers has a top surface flush with said top surface of said first portion of said second inner electrode layer, and said electrical bonding unit of said external circuit component is disposed on said second extending segments of said first external circuits and said extending segments of said second external circuits.

4. The large area passive micro light-emitting diode matrix display according to claim 2, wherein said first portion of said second inner electrode layer has a top surface, said second portion of said second inner electrode layer has a top surface lower than said top surface of said first portion of said second inner electrode layer, and each of said first inner electrode layers has a top surface flush with said top surface of said first portion of said second inner electrode layer;

each of said first external circuits further includes at least one inner connecting segment extending from said second extending segment thereof and through said first surface of said carrier to be exposed from said second surface of said carrier;

each of said second external circuits further includes a plurality of inner connecting segments which are disposed on said extending segment thereof, which are spaced apart from each other in the second direction, and which extend through said first surface of said carrier to be exposed from said second surface of said carrier; and said electrical bonding unit of said external circuit component is disposed on said inner connecting segments of said first external circuits and said inner connecting segments of said second external circuits.

5. The large area passive micro light-emitting diode matrix display according to claim 2, wherein said first portion of said second inner electrode layer has a top surface, said second portion of said second inner electrode layer has a top surface flush with said top surface of said first portion of said second inner electrode layer, and each of said first inner electrode layers has a top surface flush with said top surface of said first portion of said second inner electrode layer;

said first external circuits are disposed on said first surface of said carrier, and each of said first external circuits further includes a plurality of inner connecting segments;

said second insulation layer covers said second extending segments of said first external circuits;

said second eternal circuits span across said second extending segments of said first external circuits to permit said second eternal circuits to be isolated from said second extending segments of said first external circuits by said second insulation layer;

said inner connecting segments of each of said first external circuits are disposed on said second extending segment of said each of said first external circuits and spaced apart from each other in the first direction, and extend through and expose from said second insulation layer; and said electrical bonding unit of said external circuit component is disposed on said inner connecting segments of said first external circuits and said extending segments of said second external circuits.

6. The large area passive micro light-emitting diode matrix display according to claim 2, wherein said first portion of said second inner electrode layer has a top surface, said second portion of said second inner electrode layer has a top surface flush with said top surface of said first portion of said second inner electrode layer, and each of said first inner electrode layers has a top surface flush with said top surface of said first portion of said second inner electrode layer;

said first external circuits are disposed on said first surface of said carrier, and each of said first external circuits includes a plurality of inner connecting segments and a plurality of bridging segments;

said second insulation layer covers said second extending segments of said first external circuits and said extending segments of said second external circuits to permit an end portion of each of said extending segments of said second external circuits proximate to said first side edge of said first surface of said carrier to be exposed from said second insulation layer;

said second eternal circuits span across said second extending segments of said first external circuits, and further includes a plurality of inner connecting segments;

said inner connecting segments of each of said first external circuits are disposed on said second extending segment of said each of said first external circuits and spaced apart from each other in the first direction, and extend from said second extending segment of said each of said first external circuits and through said first surface of said carrier to be exposed from said second surface of said carrier;

said bridging segments of each of said first external circuits are disposed on said second extending segment of said each of said first external circuits, spaced apart from each other in the first direction, and embedded in said second insulation layer to permit each of said bridging segments of each of said first external circuits to span across said extending segment of a corresponding one of said second external circuits and to be connected to corresponding two of said inner connecting segments of said each of said first external circuits;

said inner connecting segments of each of said second external circuits are disposed on said extending segment of said each of said second external circuits and spaced apart from each other in the second direction to permit each of said inner connecting segments of each of said second external circuits to be spaced apart from said second extending segment of a corresponding one of said first external circuits and to extend through said second insulation layer and said first surface of said carrier to be exposed from said second surface of said carrier; and said electrical bonding unit of said external circuit component is disposed on said inner connecting segments of said first external circuits and said inner connecting segments of said second external circuits.

7. The large area passive micro light-emitting diode matrix display according to claim 1, wherein said electrical bonding unit is a conductive component selected from the group consisting of an anisotropic conductive film, a ball grid array, bumps, strips, and combinations thereof.

8. The large area passive micro light-emitting diode matrix display according to claim 1, wherein said first layer, said light-emitting layers, and said second layers of each of said micro light-emitting matrices of each of said micro light-emitting diode matrices are formed together into a plurality of micro-LED chips;

adjacent two of said micro-LED chips of each of said micro light-emitting matrices are spaced apart from each other in the first direction by a first spacing distance;

adjacent two of said micro light-emitting matrices of each of said micro light-emitting diode matrices are spaced apart from each other in the second direction by a second spacing distance; and adjacent two of said micro light-emitting matrices disposed respectively on adjacent two of said micro light-emitting diode matrices are spaced from each other in the second direction by a third spacing distance, wherein a ratio of the third spacing distance to the first spacing distance ranges from 1 to 150, and a ratio of the third spacing distance to the second spacing distance ranges from 1 to 150.

9. The large area passive micro light-emitting diode matrix display according to claim 8, wherein the first spacing distance ranges from 20 μm to 100 μm, the second spacing distance ranges from 20 μm to 100 μm, and the third spacing distance ranges from 20 μm to 3000 μm.

* * * * *